US011235560B2

(12) United States Patent
Nagamune et al.

(10) Patent No.: US 11,235,560 B2
(45) Date of Patent: Feb. 1, 2022

(54) ELECTROMAGNETIC WAVE ABSORPTION MATERIAL AND ELECTROMAGNETIC WAVE ABSORBER

(71) Applicant: ZEON CORPORATION, Tokyo (JP)

(72) Inventors: Tsutomu Nagamune, Tokyo (JP); Arinobu Katada, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 40 days.

(21) Appl. No.: 16/062,162

(22) PCT Filed: Dec. 22, 2016

(86) PCT No.: PCT/JP2016/005219
§ 371 (c)(1),
(2) Date: Jun. 14, 2018

(87) PCT Pub. No.: WO2017/110096
PCT Pub. Date: Jun. 29, 2017

(65) Prior Publication Data
US 2018/0370197 A1    Dec. 27, 2018

(30) Foreign Application Priority Data

Dec. 25, 2015  (JP) .............................. JP2015-255333
Dec. 25, 2015  (JP) .............................. JP2015-255340
Dec. 25, 2015  (JP) .............................. JP2015-255341

(51) Int. Cl.
*B32B 25/02*  (2006.01)
*C08K 3/04*   (2006.01)
(Continued)

(52) U.S. Cl.
CPC ................ *B32B 25/02* (2013.01); *B32B 7/02* (2013.01); *C01B 32/158* (2017.08); *C08L 21/00* (2013.01);
(Continued)

(58) Field of Classification Search
CPC ..... B32B 25/02; B82Y 30/00; C01B 2202/02; C01B 32/158
See application file for complete search history.

(56) References Cited

U.S. PATENT DOCUMENTS 7,854,991 B2    12/2010   Hata et al.
2008/0318049 A1  12/2008   Hata et al.
(Continued)

FOREIGN PATENT DOCUMENTS

JP    2003158395 A    5/2003
JP    2004356352 A    12/2004
(Continued)

OTHER PUBLICATIONS

Machine translation WO 2015/093600 (Year: 2015).*
(Continued)

*Primary Examiner* — Alexandre F Ferre
(74) *Attorney, Agent, or Firm* — Kenja IP Law PC

(57) ABSTRACT

An electromagnetic wave absorption material comprises: fibrous carbon nanostructures; and an insulating material, wherein a content C of the fibrous carbon nanostructures when a content of the insulating material is 100 parts by mass is 5 parts by mass or more and 15 parts by mass or less, or, in the case where the fibrous carbon nanostructures are fibrous carbon nanostructures that exhibit a convex upward shape in a t-plot obtained from an adsorption isotherm, the content C is 0.3 parts by mass or more and 0.8 parts by mass or less, and the electromagnetic wave absorption material absorbs an electromagnetic wave in a frequency domain of more than 20 GHz.

7 Claims, 1 Drawing Sheet

(51) Int. Cl.
　　　C08L 21/02　　(2006.01)
　　　H05K 9/00　　(2006.01)
　　　C01B 32/158　(2017.01)
　　　C08L 21/00　　(2006.01)
　　　B32B 7/02　　(2019.01)
　　　C09D 7/61　　(2018.01)
　　　C09D 5/32　　(2006.01)
　　　B82Y 30/00　　(2011.01)

(52) U.S. Cl.
　　　CPC .............. *C08L 21/02* (2013.01); *C09D 5/32* (2013.01); *C09D 7/61* (2018.01); *H05K 9/00* (2013.01); *H05K 9/0081* (2013.01); *B82Y 30/00* (2013.01); *C01B 2202/02* (2013.01); *C08K 3/041* (2017.05)

(56) References Cited

U.S. PATENT DOCUMENTS

| | | | | |
|---|---|---|---|---|
| 2010/0096181 A1* | 4/2010 | Nakamura | ........... | H05K 9/0083 174/394 |
| 2010/0271253 A1* | 10/2010 | Shah | ........ | H01B 1/24 342/2 |

FOREIGN PATENT DOCUMENTS

| | | |
|---|---|---|
| JP | 2009155593 A | 7/2009 |
| JP | 2010087372 A | 4/2010 |
| JP | 4621896 B2 | 1/2011 |
| JP | 2015105213 A | 6/2015 |
| WO | 2006011655 A1 | 2/2006 |
| WO | 2008126690 A1 | 10/2008 |
| WO | 2012153063 A1 | 11/2012 |
| WO | 2015093600 A1 | 6/2015 |

OTHER PUBLICATIONS

Aug. 8, 2019, the Extended European Search Report issued by the European Patent Office in the corresponding European Patent Application No. 16877999.9.

Jun. 26, 2018, International Preliminary Report on Patentability issued in the International Patent Application No. PCT/JP2016/005219.

Mar. 14, 2017, International Search Report issued in the International Patent Application No. PCT/JP2016/005219.

* cited by examiner

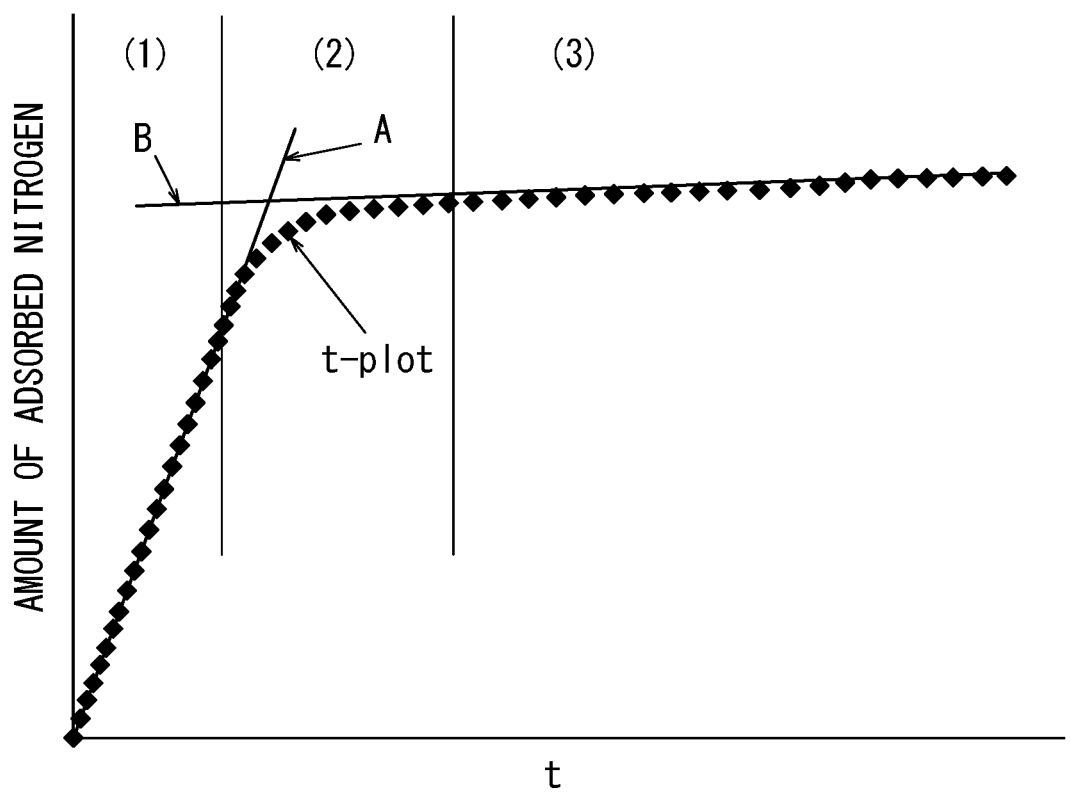

ELECTROMAGNETIC WAVE ABSORPTION MATERIAL AND ELECTROMAGNETIC WAVE ABSORBER

TECHNICAL FIELD

The present disclosure relates to an electromagnetic wave absorption material and an electromagnetic wave absorber, and especially relates to an electromagnetic wave absorption material and an electromagnetic wave absorber containing an insulating material and a conductive material.

BACKGROUND

It has been conventionally known to use composite materials obtained by blending conductive materials with insulating materials such as resin, as electromagnetic wave absorption materials in fields of electricity, communication, etc. In these fields, the use frequency differs depending on the intended use. In actual use environments, an electromagnetic wave of a frequency domain other than a required frequency domain often occurs as noise. This has created the demand for an electromagnetic wave absorption material capable of attenuating an electromagnetic wave of an unwanted frequency without attenuating an electromagnetic wave of a required frequency.

For example, a noise suppressor that contains a conductive material and an insulating material and is capable of attenuating an electromagnetic wave of a relatively high frequency domain without attenuating an electromagnetic wave of a low frequency domain has been proposed (for example, see JP 2010-87372 A (PTL 1)). Moreover, an electromagnetic wave absorption material that contains a conductive material and an insulating material and is capable of absorbing an electromagnetic wave of a frequency domain of 1 GHz or more has been proposed (for example, see JP 2003-158395 A (PTL 2)).

CITATION LIST

Patent Literatures

PTL 1: JP 2010-87372 A
PTL 2: JP 2003-158395 A

SUMMARY

Technical Problem

In recent years, frequencies of electromagnetic waves used in various application fields have been shifted toward higher frequency domains, and the need for an electromagnetic wave absorption material capable of absorbing an electromagnetic wave of a higher frequency has been growing. However, absorption capacity for an electromagnetic wave of a higher frequency domain has not been specifically addressed by the noise suppressor in PTL 1 or the electromagnetic wave absorption material in PTL 2, and its effects have been entirely unknown.

It could therefore be helpful to provide an electromagnetic wave absorption material capable of absorbing an electromagnetic wave of a high frequency domain, and an electromagnetic wave absorber including an electromagnetic wave absorption layer made of the electromagnetic wave absorption material.

Solution to Problem

The inventors conducted extensive studies to solve the problems stated above. The inventors discovered that, by containing, from among many conductive materials, fibrous carbon nanostructures in an electromagnetic wave absorption material and also limiting the content of the fibrous carbon nanostructures relative to the insulating material to a specific range, the electromagnetic wave absorption capacity of the resultant electromagnetic wave absorption material in a high frequency domain of more than 20 GHz can be enhanced sufficiently.

To advantageously solve the problems stated above, a presently disclosed electromagnetic wave absorption material comprises: fibrous carbon nanostructures; and an insulating material, wherein a content C of the fibrous carbon nanostructures when a content of the insulating material is 100 parts by mass is 5 parts by mass or more and 15 parts by mass or less, or, in the case where the fibrous carbon nanostructures are fibrous carbon nanostructures that exhibit a convex upward shape in a t-plot obtained from an adsorption isotherm, the content C is 0.3 parts by mass or more and 0.8 parts by mass or less, and the electromagnetic wave absorption material absorbs an electromagnetic wave in a frequency domain of more than 20 GHz. By limiting the content of the fibrous carbon nanostructures to the above-mentioned specific range, the absorption capacity for an electromagnetic wave of a high frequency domain of more than 20 GHz can be enhanced sufficiently.

Preferably, in the presently disclosed electromagnetic wave absorption material, the insulating material is an insulating polymer, and the insulating polymer is any of: (a) thermoplastic resin and/or thermosetting resin; and (b) rubber and/or elastomer. By containing the insulating polymer of the above-mentioned (a) or (b) in the electromagnetic wave absorption material, the absorption capacity of the electromagnetic wave absorption material for an electromagnetic wave of a high frequency domain of more than 20 GHz can be further improved, and the versatility of the electromagnetic wave absorption material can be enhanced.

Preferably, in the presently disclosed electromagnetic wave absorption material, in the case where the content C of the fibrous carbon nanostructures is 5 parts by mass or more and 15 parts by mass or less, the fibrous carbon nanostructures are multi-walled carbon nanotubes. By using multi-walled carbon nanotubes in the production of the electromagnetic wave absorption material, the production efficiency of the electromagnetic wave absorption material can be enhanced.

To advantageously solve the problems stated above, a presently disclosed electromagnetic wave absorber comprises an electromagnetic wave absorption layer formed using the electromagnetic wave absorption material described above. With the inclusion of the electromagnetic wave absorption layer formed using the electromagnetic wave absorption material in which the content of the fibrous carbon nanostructures is in the above-mentioned specific range, the absorption capacity of the electromagnetic wave absorber for an electromagnetic wave of a high frequency domain of more than 20 GHz can be enhanced sufficiently.

To advantageously solve the problems stated above, a presently disclosed electromagnetic wave absorber comprises a plurality of electromagnetic wave absorption layers each including fibrous carbon nanostructures and an insulating material, wherein fibrous carbon nanostructures and/or insulating materials included in the respective plurality of electromagnetic wave absorption layers are of a same type or different types, in the case where the plurality of electromagnetic wave absorption layers are denoted as a first electromagnetic wave absorption layer, a second electromagnetic wave absorption layer, . . . , and an nth electromagnetic wave absorption layer from a side farther from an electromagnetic wave incidence side and contents of the fibrous carbon nanostructures in the respective plurality of electromagnetic wave absorption layers are denoted as A1 parts by mass, A2 parts by mass, . . . , and An parts by mass where a content of the insulating material in a corresponding electromagnetic wave absorption layer is 100 parts by mass, the following condition (1-1) or (1-2) and condition (2) or (3) hold true:

$$5 \leq A1 \leq 15 \quad (1\text{-}1)$$

$$0.3 \leq A1 \leq 0.8, \text{in the case where the fibrous carbon nanostructures are fibrous carbon nanostructures that exhibit a convex upward shape in a } t\text{-plot obtained from an adsorption isotherm} \quad (1\text{-}2)$$

$$A1 > A2, \text{when } n \text{ is } 2 \quad (2)$$

$$A1 > A2 \geq \ldots \geq An, \text{when } n \text{ is a natural number of 3 or more} \quad (3),$$

and the first electromagnetic wave absorption layer from among all of the plurality of electromagnetic wave absorption layers has a highest content of fibrous carbon nanostructures.

With such a structure, the electromagnetic wave absorption capacity of the electromagnetic wave absorber can be further improved.

Preferably, in the presently disclosed electromagnetic wave absorber, the insulating material is an insulating polymer, and the insulating polymer is any of: (a) thermoplastic resin and/or thermosetting resin; and (b) rubber and/or elastomer. By containing the insulating polymer of the above-mentioned (a) or (b) in the electromagnetic wave absorber, the absorption capacity of the electromagnetic wave absorber for an electromagnetic wave of a high frequency domain of more than 20 GHz can be further improved, and the versatility of the electromagnetic wave absorption material can be enhanced.

Preferably, in the presently disclosed electromagnetic wave absorber, in the case where the condition (1-1) holds true, the fibrous carbon nanostructures are multi-walled carbon nanotubes. By using multi-walled carbon nanotubes in the electromagnetic wave absorber, the production efficiency of the electromagnetic wave absorber can be enhanced.

Preferably, the presently disclosed electromagnetic wave absorber further comprises an insulating layer at an outermost surface on the electromagnetic wave incidence side. Such an electromagnetic wave absorber has better electromagnetic wave absorption capacity in a high frequency domain of more than 20 GHz, and has excellent durability.

Preferably, in the presently disclosed electromagnetic wave absorber, a total thickness of the electromagnetic wave absorber is 1 μm or more and 500 μm or less. By limiting the total thickness of the electromagnetic wave absorber to the above-mentioned range, the electromagnetic wave absorption capacity in a high frequency domain can be ensured sufficiently, and also the free-standing ability when shaped in film form can be ensured sufficiently.

Advantageous Effect

It is therefore possible to provide an electromagnetic wave absorption material and an electromagnetic wave absorber capable of absorbing an electromagnetic wave of a high frequency domain of more than 20 GHz.

BRIEF DESCRIPTION OF THE DRAWINGS

In the accompanying drawings:
FIG. 1 is a graph illustrating an example of a typical t-plot.

DETAILED DESCRIPTION

One of the disclosed embodiments is described in detail below.

A presently disclosed electromagnetic wave absorption material contains fibrous carbon nanostructures and an insulating material, and may be used in an electromagnetic wave absorber in next-generation wireless LANs, automotive radar braking systems, optical transmission devices, and microwave communication equipment, without being limited thereto. The presently disclosed electromagnetic wave absorption material and electromagnetic wave absorber have excellent electromagnetic wave absorption capacity in a high frequency domain of more than 20 GHz.

(Electromagnetic Wave Absorption Material)

The presently disclosed electromagnetic wave absorption material contains fibrous carbon nanostructures and an insulating material. It is necessary that, in the electromagnetic wave absorption material, the content C of the fibrous carbon nanostructures when the content of the insulating material is 100 parts by mass is 5 parts by mass or more and 15 parts by mass or less, or, in the case where the fibrous carbon nanostructures are fibrous carbon nanostructures that exhibit a convex upward shape in a t-plot obtained from an adsorption isotherm, the content C is 0.3 parts by mass or more and 0.8 parts by mass or less. With the presently disclosed electromagnetic wave absorption material, typically, an electromagnetic wave of a high frequency domain of more than 20 GHz can be absorbed.

Regarding electromagnetic wave absorption of a composite material containing fibrous carbon nanostructures and an insulating material, the following points are commonly known. When a composite material containing fibrous carbon nanostructures and an insulating material is irradiated with an electromagnetic wave, the electromagnetic wave is repeatedly reflected between the fibrous carbon nanostructures in the composite material, and the electromagnetic wave attenuates. Moreover, when the fibrous carbon nanostructures reflect the electromagnetic wave, the fibrous carbon nanostructures absorb the electromagnetic wave and convert it into heat.

Since electromagnetic wave energy is higher when frequency is higher, it seems that higher content of the fibrous carbon nanostructures is more effective in enhancing the electromagnetic wave absorption capacity in a high frequency domain.

However, as a result of studying the electromagnetic wave absorption capacity in a high frequency domain by varying the blending amount of the fibrous carbon nanostructures relative to 100 parts by mass of the insulating material, the inventors surprisingly discovered that the electromagnetic wave absorption capacity in a high frequency domain can be significantly improved with such a blending amount range that can realize the above-mentioned content.

As used herein, the content of each material in the production of the electromagnetic wave absorption material is equal to the content of the corresponding material in the produced electromagnetic wave absorption material.

<Fibrous Carbon Nanostructures>

The fibrous carbon nanostructures used in the presently disclosed electromagnetic wave absorption material are not limited, and any fibrous carbon nanostructures may be used. The fibrous carbon nanotubes may be composed solely of carbon nanotubes (hereinafter also referred to as "CNTs") or may be a mixture of CNTs and fibrous carbon nanostructures other than CNTs, without being limited thereto.

More specifically, examples of fibrous carbon nanostructures that can be used in the presently disclosed electromagnetic wave absorption material include fibrous carbon nanostructures that exhibit a convex upward shape in a t-plot obtained from an adsorption isotherm, and other fibrous carbon nanostructures.

As used herein, "fibrous carbon nanostructures" typically denote a fibrous carbon material of less than 1 μm in outer diameter (fiber diameter). As used herein, "fiber" or "fibrous" typically denotes a structure with an aspect ratio of 5 or more. The aspect ratio can be found by measuring the diameters and lengths of 100 fibrous carbon nanostructures randomly selected by a transmission electron microscope and calculating the average of ratios of length to diameter (length/diameter).

[Fibrous Carbon Nanostructures that Exhibit Convex Upward Shape in t-Plot]

The fibrous carbon nanostructures that exhibit a convex upward shape in a t-plot are not limited, as long as they exhibit a convex upward shape in a t-plot obtained from an adsorption isotherm. Examples include CNTs and vapor-grown carbon fibers. Any one of such fibrous carbon nanostructures may be used individually, or any two or more of such fibrous carbon nanostructures may be used in combination. The use of the fibrous carbon nanostructures that exhibit a convex upward shape in a t-plot limits aggregation of the fibrous carbon nanostructures, and can reduce the additive amount necessary for achieving desired performance. Hence, an electromagnetic wave absorption material having excellent conductivity and electromagnetic wave absorption capacity in a high frequency domain of more than 20 GHz and also having excellent durability can be obtained.

The fibrous carbon nanostructures that exhibit a convex upward shape in a t-plot are preferably fibrous carbon nanostructures including CNTs. The CNTs contained in the fibrous carbon nanostructures that exhibit a convex upward shape in a t-plot are preferably CNTs that have not undergone opening formation treatment.

As used herein, "exhibiting a convex upward shape in a t-plot" denotes exhibiting a convex upward shape in a t-plot obtained from an adsorption isotherm.

Typically, adsorption is a phenomenon in which gas molecules are taken onto a solid surface from the gas phase and is categorized as physical adsorption or chemical adsorption depending on the main cause of adsorption. The nitrogen gas adsorption method employed in the acquisition of t-plot utilizes physical adsorption. Usually, when the adsorption temperature is constant, the number of nitrogen gas molecules that are adsorbed by fibrous carbon nanostructures increases with increasing pressure. A plot of the relative pressure (ratio of pressure at adsorption equilibrium P and saturated vapor pressure P0) on a horizontal axis and the amount of adsorbed nitrogen gas on a vertical axis is referred to as an "isotherm." The isotherm is referred to as an "adsorption isotherm" in a situation in which the amount of adsorbed nitrogen gas is measured while increasing the pressure and is referred to as a "desorption isotherm" in a situation in which the amount of adsorbed nitrogen gas is measured while decreasing the pressure.

The t-plot is obtained from the adsorption isotherm measured by the nitrogen gas adsorption method by converting the relative pressure to an average thickness t (nm) of an adsorbed layer of nitrogen gas. Specifically, an average adsorbed nitrogen gas layer thickness t corresponding to a given relative pressure is calculated from a known standard isotherm of average adsorbed nitrogen gas layer thickness t plotted against relative pressure P/P0 and the relative pressure is converted to the corresponding average adsorbed nitrogen gas layer thickness t to obtain a t-plot for the fibrous carbon nanostructures (t-plot method of de Boer et al.).

FIG. 1 illustrates a typical t-plot of a sample having pores at its surface. In a sample having pores at its surface, the growth of the adsorbed layer of nitrogen gas is categorized into the following processes (1) to (3). As illustrated in FIG. 1, the gradient of the t-plot changes in accordance with these processes (1) to (3):

(1) a process in which a single molecular adsorption layer is formed over the entire surface by nitrogen molecules;

(2) a process in which a multi-molecular adsorption layer is formed in accompaniment to capillary condensation filling of pores; and (3) a process in which a multi-molecular adsorption layer is formed on a surface that appears to be non-porous due to the pores being filled by nitrogen.

The t-plot of the fibrous carbon nanostructures used in the present disclosure is on a straight line passing through the origin in a region in which the average adsorbed nitrogen gas layer thickness t is small, but, as t increases, the plot deviates downward from the straight line to form a convex upward shape, as illustrated in FIG. 1. This shape of the t-plot indicates that the fibrous carbon nanostructures have a large internal specific surface area as a proportion of total specific surface area and that there are a large number of openings in the carbon nanostructures constituting the fibrous carbon nanostructures. This suppresses aggregation of the fibrous carbon nanostructures.

The bending point of the t-plot of the fibrous carbon nanostructures is preferably in a range satisfying $0.2 \leq t$ (nm)$\leq 1.5$, more preferably in a range satisfying $0.45 \leq t$ (nm)$\leq 1.5$, and further preferably in a range satisfying $0.55 \leq t$ (nm)$\leq 1.0$. If the position of the bending point of the t-plot is in the above-mentioned range, aggregation of the fibrous carbon nanostructures is further suppressed, and an electromagnetic wave absorption material capable of forming an electromagnetic wave absorption layer having better absorption characteristics for an electromagnetic wave in a high frequency domain can be yielded.

Herein, the "position of the bending point" is an intersection point of an approximated straight line A for the above-mentioned process (1) and an approximated straight line B for the above-mentioned process (3).

The fibrous carbon nanostructures preferably have a ratio of an internal specific surface area S2 to a total specific surface area S1 (S2/S1) of 0.05 or more and 0.30 or less, obtained from the t-plot. If S2/S1 is 0.05 or more and 0.30 or less, aggregation of the fibrous carbon nanostructures is further suppressed, and an electromagnetic wave absorption material capable of forming an electromagnetic wave absorption layer having better absorption characteristics for an electromagnetic wave in a high frequency domain can be yielded.

Each of the total specific surface area S1 and the internal specific surface area S2 of the fibrous carbon nanostructures is not limited, but S1 is preferably 400 $m^2/g$ or more and 2500 $m^2/g$ or less and further preferably 800 $m^2/g$ or more and 1200 $m^2/g$ or less, and S2 is preferably 30 $m^2/g$ or more and 540 $m^2/g$ or less.

The total specific surface area S1 and the internal specific surface area S2 of the fibrous carbon nanostructures can be found from the t-plot. In the case of the t-plot illustrated in FIG. 1, first, the total specific surface area S1 can be found from the gradient of the approximated straight line corresponding to the process (1) and an external specific surface area S3 can be found from the gradient of the approximated straight line corresponding to the process (3). The internal specific surface area S2 can then be calculated by subtracting the external specific surface area S3 from the total specific surface area S1.

The measurement of the adsorption isotherm, the preparation of the t-plot, and the calculation of the total specific surface area S1 and the internal specific surface area S2 based on t-plot analysis for the fibrous carbon nanostructures can be performed using, for example, BELSORP®-mini (BELSORP is a registered trademark in Japan, other countries, or both), a commercially available measurement instrument available from Bel Japan Inc.

In the case of using fibrous carbon nanostructures including CNTs as the fibrous carbon nanostructures that exhibit a convex upward shape in a t-plot, the CNTs in the fibrous carbon nanostructures may include single-walled carbon nanotubes and/or multi-walled carbon nanotubes. The CNTs included in the fibrous carbon nanostructures that exhibit a convex upward shape in a t-plot are preferably single- to up to 5-walled carbon nanotubes, and more preferably single-walled carbon nanotubes. The use of single-walled carbon nanotubes as the fibrous carbon nanostructures that exhibit a convex upward shape in a t-plot allows for improvement in thin-film property and electromagnetic wave absorption capacity in a high frequency domain with favorable balance.

The fibrous carbon nanostructures that exhibit a convex upward shape in a t-plot are preferably fibrous carbon nanostructures for which a ratio (3σ/Av) of the diameter standard deviation (σ) multiplied by 3 (3σ) relative to the average diameter (Av) is more than 0.20 and less than 0.60, more preferably fibrous carbon nanostructures for which 3σ/Av is more than 0.25, and further preferably fibrous carbon nanostructures for which 3σ/Av is more than 0.40. The use of fibrous carbon nanostructures for which 3σ/Av is more than 0.20 and less than 0.60 enables the obtainment of an electromagnetic wave absorption material capable of forming an electromagnetic wave absorption layer having better electromagnetic wave absorption capacity in a high frequency domain.

Herein, the "average diameter (Av) of the fibrous carbon nanostructures" and the "diameter standard deviation (σ: sample standard deviation) of the fibrous carbon nanostructures" can each be obtained by measuring the diameters (external diameters) of 100 randomly selected fibrous carbon nanostructures using a transmission electron microscope. The average diameter (Av) and the standard deviation (σ) of the fibrous carbon nanostructures may be adjusted by changing the production method and the production conditions of the fibrous carbon nanostructures, or adjusted by combining a plurality of types of fibrous carbon nanostructures obtained by different production methods.

As the fibrous carbon nanostructures that exhibit a convex upward shape in a t-plot, the fibrous carbon nanostructures that are typically used take a normal distribution when a plot is made of diameter measured as described above on a horizontal axis and probability density on a vertical axis, and a Gaussian approximation is made.

As the fibrous carbon nanostructures that exhibit a convex upward shape in a t-plot, the fibrous carbon nanostructures preferably exhibit a radial breathing mode (RBM) peak when evaluated by Raman spectroscopy. Note that an RBM is not present in the Raman spectrum of fibrous carbon nanostructures composed only of multi-walled carbon nanotubes having three or more walls.

As the fibrous carbon nanostructures that exhibit a convex upward shape in a t-plot, in a Raman spectrum of the fibrous carbon nanostructures, a ratio (G/D ratio) of G band peak intensity relative to D band peak intensity is preferably 1 or more and 20 or less. If the G/D ratio is 1 or more and 20 or less, an electromagnetic wave absorption material in which fibrous carbon nanostructures have excellent dispersibility and that is capable of forming an electromagnetic wave absorption layer having better absorption characteristics for an electromagnetic wave in a high frequency domain is obtained.

The average length of a structure of the fibrous carbon nanostructures that exhibit a convex upward shape in a t-plot at the time of synthesis is preferably 100 μm or more. Fibrous carbon nanostructures that have a longer structure length at the time of synthesis tend to be more easily damaged by breaking, severing, or the like during dispersion. Therefore, it is preferable that the average length of the structure at the time of synthesis is 5000 μm or less.

The aspect ratio (length/diameter) of the fibrous carbon nanostructures that exhibit a convex upward shape in a t-plot is preferably more than 10.

The BET specific surface area of the fibrous carbon nanostructures that exhibit a convex upward shape in a t-plot is preferably 400 $m^2/g$ or more, more preferably 600 $m^2/g$ or more, and further preferably 800 $m^2/g$ or more, and preferably 2500 $m^2/g$ or less and more preferably 1200 $m^2/g$ or less. If the BET specific surface area of the fibrous carbon nanostructures that exhibit a convex upward shape in a t-plot is 400 $m^2/g$ or more, the electromagnetic wave absorption capacity of the electromagnetic wave absorption material in a high frequency domain can be sufficiently ensured. If the BET specific surface area of the fibrous carbon nanostructures that exhibit a convex upward shape in a t-plot is 2500 $m^2/g$ or less, an electromagnetic wave absorption material with excellent film formability can be produced.

As used herein, "BET specific surface area" refers to a nitrogen adsorption specific surface area measured by the BET method.

In accordance with the super growth method described later, the fibrous carbon nanostructures that exhibit a convex upward shape in a t-plot are obtained, on a substrate having thereon a catalyst layer for carbon nanotube growth, in the form of an aggregate wherein fibrous carbon nanostructures are aligned substantially perpendicularly to the substrate (aligned aggregate). The mass density of the fibrous carbon nanostructures in the form of such an aggregate is preferably 0.002 $g/cm^3$ or more and 0.2 $g/cm^3$ or less. A mass density of 0.2 $g/cm^3$ or less allows the fibrous carbon nanostructures to be homogeneously dispersed because binding among the fibrous carbon nanostructures is weakened. Consequently, the electromagnetic wave absorption capacity of the electromagnetic wave absorption material in a high frequency domain can be further enhanced. A mass density of 0.002 $g/cm^3$ or more improves the unity of the fibrous carbon nanostructures, thus preventing the fibrous carbon nanostructures from becoming unbound and making the fibrous carbon nanostructures easier to handle.

The fibrous carbon nanostructures that exhibit a convex upward shape in a t-plot preferably include a plurality of micropores. In particular, the fibrous carbon nanostructures that exhibit a convex upward shape in a t-plot preferably include micropores that have a pore diameter of less than 2 nm. The amount of these micropores as measured in terms of micropore volume determined by the method described below is preferably 0.40 mL/g or more, more preferably 0.43 mL/g or more, and further preferably 0.45 mL/g or more, with the upper limit being generally on the order of 0.65 mL/g. The presence of such micropores in the fibrous carbon nanostructures that exhibit a convex upward shape in a t-plot further limits aggregation of the fibrous carbon nanostructures. Micropore volume can be adjusted, for example, by appropriate alteration of the production method and the production conditions of the fibrous carbon nanostructures.

Herein, "micropore volume (Vp)" can be calculated using Equation (I): $Vp=(V/22414)\times(M/\rho)$ by measuring a nitrogen adsorption isotherm of the fibrous carbon nanostructures at liquid nitrogen temperature (77 K) with the amount of adsorbed nitrogen at a relative pressure $P/P0=0.19$ defined as V, where P is a measured pressure at adsorption equilibrium, and P0 is a saturated vapor pressure of liquid nitrogen at time of measurement. In Equation (I), M is a molecular weight of 28.010 of the adsorbate (nitrogen), and $\rho$ is a density of 0.808 g/cm$^3$ of the adsorbate (nitrogen) at 77 K. Micropore volume can be measured, for example, using BELSORP®-mini produced by Bel Japan Inc.

The fibrous carbon nanostructures that exhibit a convex upward shape in a t-plot can be efficiently produced, for example, by forming a catalyst layer on a substrate surface by wet process in the method (super growth method, see WO2006/011655) wherein during synthesis of CNTs through chemical vapor deposition (CVD) by supplying a feedstock compound and a carrier gas onto a substrate having thereon a catalyst layer for carbon nanotube production, the catalytic activity of the catalyst layer is dramatically improved by providing a trace amount of an oxidizing agent (catalyst activating material) in the system. Hereinafter, carbon nanotubes obtained by the super growth method are also referred to as "SGCNTs."

The fibrous carbon nanostructures produced by the super growth method may be composed solely of SGCNTs, or may be composed of SGCNTs and electrically conductive non-cylindrical carbon nanostructures. Specifically, the fibrous carbon nanostructures may include single- or multi-walled flattened cylindrical carbon nanostructures having over the entire length a tape portion where inner walls are in close proximity to each other or bonded together (hereinafter such carbon nanostructures are also referred to as "graphene nanotapes (GNTs)").

The phrase "having over the entire length a tape portion" as used herein refers to "having a tape portion over 60% or more, preferably 80% or more, more preferably 100% of the length of the longitudinal direction (entire length), either continuously or intermittently."

GNT is presumed to be a substance having over the entire length a tape portion where inner walls are in close proximity to each other or bonded together since it has been synthesized, and having a network of 6-membered carbon rings in the form of flattened cylindrical shape. GNT's flattened cylindrical structure and the presence of a tape portion where inner walls are in close proximity to each other or bonded together in the GNT can be confirmed, for example, as follows: GNT and fullerene (C60) are sealed into a quartz tube and subjected to heat treatment under reduced pressure (fullerene insertion treatment) to form a fullerene-inserted GNT, followed by observation under a transmission electron microscope (TEM) of the fullerene-inserted GNT to confirm the presence of part in the GNT where no fullerene is inserted (tape portion).

The shape of the GNT is preferably such that it has a tape portion at the central part in the width direction. More preferably, the shape of a cross-section of the GNT, perpendicular to the extending direction (axial direction), is such that the maximum dimension in a direction perpendicular to the longitudinal direction of the cross section is larger in the vicinity of opposite ends in the longitudinal direction of the cross section than in the vicinity of the central part in the longitudinal direction of the cross section. Most preferably, a cross-section of the GNT perpendicular to the extending direction (axial direction) has a dumbbell shape.

The term "vicinity of the central part in the longitudinal direction of a cross section" used for the shape of a cross section of GNT refers to a region within 30% of longitudinal dimension of the cross section from the line at the longitudinal center of the cross section (i.e., a line that passes through the longitudinal center of the cross section and is perpendicular to the longitudinal line in the cross section). The term "vicinity of opposite ends in the longitudinal direction of a cross section" refers to regions outside the "vicinity of the central part in the longitudinal direction of a cross section" in the longitudinal direction.

Fibrous carbon nanostructures including GNTs as non-cylindrical carbon nanostructures can be obtained by, when synthesizing CNTs by the super growth method using a substrate having thereon a catalyst layer (hereinafter also referred to as a "catalyst substrate"), forming the catalyst substrate using a specific method. Specifically, fibrous carbon nanostructures including GNTs can be obtained through synthesis of CNTs by the super growth method using a catalyst substrate prepared as follows: Coating liquid A containing an aluminum compound is applied on a substrate and dried to form an aluminum thin film (catalyst support layer) on the substrate, followed by application of coating liquid B containing an iron compound on the aluminum thin film and drying of the coating liquid B at a temperature of 50° C. or less to form an iron thin film (catalyst layer) on the aluminum thin film.

The concentration of metal impurities contained in the fibrous carbon nanostructures that exhibit a convex upward shape in a t-plot is preferably less than 5000 ppm, and more preferably less than 1000 ppm, in terms of reducing impurities in the electromagnetic wave absorption material and enabling the production of a long-life product.

As used herein, the concentration of metal impurities can be measured, for example, by a transmission electron microscope (TEM), a scanning electron microscope (SEM), energy dispersive X-ray analysis (EDAX), a vapor-phase decomposition device and ICP mass spectrometry (VPD, ICP/MS), etc.

Herein, metal impurities include, for example, a metal catalyst used in the production of the fibrous carbon nanostructures. Examples include metal elements to which alkali metal, alkaline-earth metal, groups 3 to 13, and lanthanoid group belong, metal elements such as Si, Sb, As, Pb, Sn, and Bi, and metal compounds containing these elements. More specific examples include metal elements such as Al, Sb, As, Ba, Be, Bi, B, Cd, Ca, Cr, Co, Cu, Ga, Ge, Fe, Pb, Li, Mg, Mn, Mo, Ni, K, Na, Sr, Sn, Ti, W, V, Zn, and Zr, and metal compounds containing these elements.

In terms of further improving the dispersibility of the fibrous carbon nanostructures in the electromagnetic wave absorption material and enabling the formation of a uniform electromagnetic wave absorption layer, the fibrous carbon nanostructures that exhibit a convex upward shape in a t-plot preferably do not substantially contain particulate impurities with a particle diameter of more than 500 nm, more preferably do not substantially contain particulate impurities with a particle diameter of more than 300 nm, further preferably do not substantially contain particulate impurities with a particle diameter of more than 100 nm, and particularly preferably do not substantially contain particulate impurities with a particle diameter of more than 45 nm.

As used herein, the concentration of particulate impurities can be measured by applying a fibrous carbon nanostructure dispersion liquid onto a substrate and measuring the surface using, for example, "surfscan" produced by KLA Tencor Corporation.

[Other Fibrous Carbon Nanostructures]

The other fibrous carbon nanostructures that can be used as the fibrous carbon nanostructures in the electromagnetic wave absorption material and that are other than the fibrous carbon nanostructures that exhibit a convex upward shape in a t-plot obtained from an adsorption isotherm include, for example, fibrous carbon nanostructures that do not exhibit a convex upward shape in a t-plot obtained from an adsorption isotherm. More specifically, the other fibrous carbon nanostructures include, for example, fibrous carbon nanostructures that exhibit a convex downward shape in a t-plot obtained from an adsorption isotherm. The other fibrous carbon nanostructures preferably include multi-walled CNTs.

The multi-walled CNTs are not limited, and may be CNTs having a plurality of walls. Multi-walled CNTs of three or more walls and 15 or less walls are more preferable. As used herein, "multi-walled" indicates a state in which two or more single-walled tubes are nested within one another. The use of multi-walled CNTs is advantageous over the use of single-walled CNTs in that it provides high dispersibility in a solvent and so contributes to excellent productivity of the electromagnetic wave absorption material.

The BET specific surface area of the multi-walled CNTs is preferably 150 m$^2$/g or more and more preferably 200 m$^2$/g or more, and preferably 550 m$^2$/g or less and more preferably less than 400 m$^2$/g. If the BET specific surface area of the multi-walled CNTs is 150 m$^2$/g or more, the electromagnetic wave absorption capacity of the electromagnetic wave absorption material in a high frequency domain can be sufficiently ensured. If the BET specific surface area of the multi-walled CNTs is 550 m$^2$/g or less, an electromagnetic wave absorption material with excellent flexibility and film formability can be produced.

The multi-walled CNTs may be produced, for example, by laser ablation method, arc discharge CVD (Chemical Vapor Deposition) method, plasma CVD method, gas phase method, or combustion method, without being limited thereto. Multi-walled CNTs produced by any method are usable in the present disclosure.

Specifically, examples of commercially available multi-walled CNTs include "Baytubes C150P" and "Baytubes C70P" manufactured by Bayer Material Science, "Nanocyl 7000" manufactured by Nanocyl SA, "K-nanos-100P" manufactured by Kumho Petrochemical, "Flotube 9000" manufactured by CNano Technology Ltd., and "JC142" manufactured by JEIO Co., Ltd.

—Average Diameter of Fibrous Carbon Nanostructures—

The average diameter (Av) of the fibrous carbon nanostructures used in the presently disclosed electromagnetic wave absorption material is preferably 0.5 nm or more and further preferably 1 nm or more, and preferably 15 nm or less and further preferably 10 nm or less. If the average diameter (Av) of the fibrous carbon nanostructures is 0.5 nm or more, the electromagnetic wave absorption capacity of the electromagnetic wave absorption material in a high frequency domain can be further enhanced. If the average diameter (Av) of the fibrous carbon nanostructures is 15 nm or less, the flexibility of the electromagnetic wave absorption material can be improved.

—Content of Fibrous Carbon Nanostructures—

In the presently disclosed electromagnetic wave absorption material, the content C of the fibrous carbon nanostructures when the content of the insulating material is 100 parts by mass is 5 parts by mass or more and 15 parts by mass or less, or, in the case where the fibrous carbon nanostructures are fibrous carbon nanostructures that exhibit a convex upward shape in a t-plot obtained from an adsorption isotherm, the content C is 0.3 parts by mass or more and 0.8 parts by mass or less. By limiting the content of the fibrous carbon nanostructures to the above-mentioned range, the electromagnetic wave absorption capacity in a high frequency domain can be enhanced sufficiently.

In the case where the fibrous carbon nanostructures are fibrous carbon nanostructures that exhibit a convex upward shape in a t-plot, the content of the fibrous carbon nanostructures when the content of the insulating material is 100 parts by mass is preferably 0.4 parts by mass or more, and preferably 0.8 parts by mass or less and more preferably 0.6 parts by mass or less.

In the case where the fibrous carbon nanostructures are the other fibrous carbon nanostructures mentioned above, the content of the fibrous carbon nanostructures when the content of the insulating material is 100 parts by mass is preferably 6 parts by mass or more and more preferably 7 parts by mass or more, and preferably 13 parts by mass or less and more preferably 10 parts by mass or less.

<Insulating Material>

As the insulating material, an insulating polymer is preferably used. The insulating polymer may be any of: (a) thermoplastic resin and/or thermosetting resin; and (b) rubber and/or elastomer.

As used herein, the insulating material and the insulating polymer preferably have a volume resistivity measured in accordance with JIS K 6911 of $10^{11}$ Ω·cm or more. The insulating polymer has the insulating polymer (a) or (b) as a main component. As used herein, "having as a main component" means that its content is 50 mass % or more, preferably more than 50 mass %, and more preferably 100 mass % relative to 100 mass % of the insulating polymer.

In the case where the insulating polymer (a) or (b) is used as the insulating material, the absorption capacity of the electromagnetic wave absorption material for an electromagnetic wave of a high frequency domain of more than 20 GHz can be further improved. Moreover, in the case where the insulating polymer (a) is used, the electromagnetic wave absorption material has excellent strength and durability. In the case where the insulating polymer (b) is used as the insulating material, the electromagnetic wave absorption material has excellent flexibility. Thus, the flexibility or strength of the electromagnetic wave absorption material is adjustable depending on the intended use of the electromagnetic wave absorption material, so that the versatility of the electromagnetic wave absorption material can be enhanced.

[(a) Thermoplastic Resin and/or Thermosetting Resin]

The thermoplastic resin and/or thermosetting resin included in the insulating polymer is not limited, and may be known thermoplastic resin and/or thermosetting resin having insulation property. Examples of such thermoplastic resin and/or thermosetting resin include cellulosic resin, cellulose acetate, cellulose nitrate, cellulose acetate butyrate, casein plastic, soybean protein plastic, phenol resin, urea resin, melamine resin, benzoguanamine resin, epoxy resin, diallyl phthalate resin, unsaturated polyester resin, bisphenol A-type epoxy resin, novolak-type epoxy resin, polyfunctionalized epoxy resin, alicyclic epoxy resin, alkyd resin, urethane resin, vinyl chloride resin, polyethylene, polypropylene, polystyrene, nylon, vinylon, acrylic fiber, rayon, polyvinyl acetate, vinyl ether resin, ABS resin, AS resin, acrylic resin, methacrylic resin, polyacetal, polyimide, polycarbonate, modified polyphenylene ether (PPE), polyethylene terephthalate, polybutylene terephthalate, polyalylate, polysulfone, polyphenylene sulfide, polyether ether ketone, fluororesin such as polytetrafluoroethylene, polyamide, polyimide, and polycycloolefin. One of these resins may be used individually, or two or more of these resins may be used as a mixture.

[(b) Rubber and/or Elastomer]

The rubber and/or elastomer included in the insulating polymer is not limited, and may be known rubber and/or elastomer having insulation property. Examples of such rubber and/or elastomer include: elastomers such as natural rubber (NR), epoxidized natural rubber (ENR), styrene-butadiene rubber (SBR), nitrile rubber (NBR), chloroprene rubber (CR), ethylene-propylene rubber (EPR, EPDM), butyl rubber (IIR), chlorobutyl rubber (CIIR), acrylic rubber (ACM), silicone rubber (Q), fluororubber (FKM), butadiene rubber (BR), epoxidized butadiene rubber (EBR), epichlorohydrin rubber (CO, CEO), urethane rubber (U), polysulfide rubber (T), acrylonitrile-butadiene rubber, ethylene vinyl acetate rubber, vinylpyridine rubber, and polyisoprene rubber; thermoplastic elastomers such as olefin-based (TPO), polyvinyl chloride-based (TPVC), polyester-based (TPEE), polyurethane-based (TPU), polyamide-based (TPEA), and styrene-based (SBS); and mixtures thereof. One of these elastomers may be used individually, or two or more of these elastomers may be used as a mixture.

[Insulating Filler]

The insulating material may be blended with any insulating filler. The insulating filler is not limited, and an insulating filler such as a known inorganic filler or organic filler may be used. Examples of the insulating filler include silica, talc, clay, and titanium oxide. One of these fillers may be used individually, or two or more of these fillers may be used as a mixture.

<Other Components>

The presently disclosed electromagnetic wave absorption material may contain known additives depending on the intended use. Examples of the known additives include an antioxidant, a thermal stabilizer, a light stabilizer, an ultraviolet absorber, a cross-linking agent, a pigment, a coloring agent, a foaming agent, an antistatic agent, a flame retardant, a lubricant, a softener, a tackifier, a plasticizer, a mold release agent, a deodorizer, and perfume. Any one of such additives may be used individually, or any two or more of such additives may be used in combination.

<Properties of Electromagnetic Wave Absorption Material>

[Electromagnetic Wave Reflection Attenuation Amount]

The electromagnetic wave absorption material absorbs an electromagnetic wave of a frequency domain of more than 20 GHz. In particular, the reflection attenuation amount of the electromagnetic wave absorption material for an electromagnetic wave of a frequency of 60 GHz is preferably 7 dB or more, and more preferably 10 dB or more. The reflection attenuation amount of the electromagnetic wave absorption material for an electromagnetic wave of a frequency of 76 GHz is preferably 6 dB or more, more preferably 9 dB or more, and further preferably 10 dB or more. Furthermore, it is preferable that the reflection attenuation amount of the electromagnetic wave absorption material in a frequency range of more than 60 GHz and less than 76 GHz is always higher than a smaller value of respective reflection attenuation amounts at frequencies of 60 GHz and 76 GHz. If the reflection attenuation amount in a high frequency domain such as frequencies of 60 GHz and 76 GHz is in the above-mentioned range, excellent electromagnetic wave cutoff performance in a high frequency domain can be achieved.

As used herein, "reflection attenuation amount" can be measured by the method described in the examples section.

"Flexibility"

The presently disclosed electromagnetic wave absorption material has high flexibility in the case where the (b) rubber and/or elastomer which is an insulating polymer is used as the insulating material. In such a case, the value of tensile breaking strain (%) measured in a tensile test in accordance with JIS K 6251 is preferably 100% or more, more preferably 150% or more, and further preferably 200% or more. As used herein, the "value of tensile breaking strain (%)" is a value representing, in percentage, a result of dividing the length of a specimen upon a break (cut) of the specimen in the tensile test in accordance with JIS K 6251 by the original length of the specimen. If the value of tensile breaking strain is the above-mentioned lower limit or more, the electromagnetic wave absorption material has sufficient flexibility, and, for example when shaped in a thin film, exhibits sufficient durability.

(Electromagnetic Wave Absorber)

The presently disclosed electromagnetic wave absorber includes at least one electromagnetic wave absorption layer containing fibrous carbon nanostructures and an insulating material. The presently disclosed electromagnetic wave absorber includes at least one electromagnetic wave absorption layer formed using the presently disclosed electromagnetic wave absorption material. The electromagnetic wave absorber including the electromagnetic wave absorption layer formed using the presently disclosed electromagnetic wave absorption material has excellent electromagnetic wave absorption capacity in a high frequency domain.

As used herein, the term "electromagnetic wave absorber" denotes a structure including an electromagnetic wave absorption layer obtained by shaping, in layer (film) form, a material containing insulating resin and fibrous carbon nanostructures. On the other hand, the term "electromagnetic wave absorption material" denotes, for example, an electromagnetic wave absorption material in a state of being present as a material before being shaped as an electromagnetic wave absorption layer, and, in a broader sense, includes a shaped product that is shaped in a shape/structure not including an electromagnetic wave absorption layer.

<Structure of Electromagnetic Wave Absorber>

The presently disclosed electromagnetic wave absorber may be a single-layer electromagnetic wave absorber including a single electromagnetic wave absorption layer, or a multi-layer electromagnetic wave absorber including a plurality of electromagnetic wave absorption layers.

In particular, in the case where the presently disclosed electromagnetic wave absorber is a multi-layer electromagnetic wave absorber, the presently disclosed electromagnetic wave absorber includes a plurality of electromagnetic wave absorption layers each including fibrous carbon nanostructures and an insulating material. The fibrous carbon nanostructures and/or the insulating materials included in the respective layers may be of the same type or different types. In the case where the plurality of electromagnetic wave absorption layers are denoted as a first electromagnetic wave absorption layer, a second electromagnetic wave absorption layer, . . . , and an nth electromagnetic wave absorption layer from the side farther from the electromagnetic wave incidence side and the contents of the fibrous carbon nanostructures in the respective electromagnetic wave absorption layers are denoted as A1 parts by mass, A2 parts by mass, . . . , and An parts by mass where the content of the insulating material is 100 parts by mass, the following condition (1-1) or (1-2) and condition (2) or (3) hold true. Moreover, it is preferable that the first electromagnetic wave absorption layer from among all layers constituting the electromagnetic wave absorber has a highest content of fibrous carbon nanostructures. In terms of the productivity of the electromagnetic wave absorber, it is preferable that n=2 to 5.

$$5 \leq A1 \leq 15 \quad (1\text{-}1)$$

$$0.3 \leq A1 \leq 0.8, \text{in the case where the fibrous carbon}$$
nanostructures are fibrous carbon nanostructures
that exhibit a convex upward shape in a $t$-plot
obtained from an adsorption isotherm $\quad (1\text{-}2)$ $$A1 > A2, \text{when } n \text{ is } 2 \quad (2)$$

$$A1 > A2 \geq \ldots \geq An, \text{when } n \text{ is a natural number of 3 or more} \quad (3).$$

Thus, by forming, in the electromagnetic wave absorber including the plurality of electromagnetic wave absorption layers, such a concentration gradient of fibrous carbon nanostructures that increases from the side nearer the electromagnetic wave incidence side toward the side farther from the electromagnetic wave incidence side (i.e. in the electromagnetic wave travel direction from the electromagnetic wave incidence side), it is possible to allow an electromagnetic wave to enter deeply into the electromagnetic wave absorber. This can suppress an excessive temperature increase only in the vicinity of the surface of the electromagnetic wave absorber facing the electromagnetic wave incidence side. Furthermore, with such a structure, an electromagnetic wave incident from a direction inclined with respect to a normal line of the electromagnetic wave absorber (direction diagonal to the surface) can be absorbed, too. Hence, the electromagnetic wave absorption performance of the electromagnetic wave absorber can be enhanced. Herein, "normal line of the electromagnetic wave absorber" is a normal line of the electromagnetic wave absorber with respect to the outermost surface on the electromagnetic wave incidence side.

The content A1 in the first layer differs depending on the type of fibrous carbon nanostructures included in the first electromagnetic wave absorption layer.

In the case where the fibrous carbon nanostructures are fibrous carbon nanostructures that exhibit a convex upward shape in a $t$-plot, the content of the fibrous carbon nanostructures when the content of the insulating material in the first electromagnetic wave absorption layer is 100 parts by mass is preferably 0.4 parts by mass or more, and preferably 0.8 parts by mass or less and more preferably 0.6 parts by mass or less.

In the case where the fibrous carbon nanostructures are multi-walled CNTs, the content of the fibrous carbon nanostructures when the content of the insulating material in the first electromagnetic wave absorption layer is 100 parts by mass is preferably 5 parts by mass or more, more preferably 6 parts by mass or more, and still more preferably 8 parts by mass or more, and preferably 13 parts by mass or less and more preferably 10 parts by mass or less.

The contents A2 to An in the second layer to the nth layer need not necessarily be more than or equal to the same lower limit as the first electromagnetic wave absorption layer, and may be less than the lower limit. Specifically, in the case where the fibrous carbon nanostructures are fibrous carbon nanostructures that exhibit a convex upward shape in a $t$-plot, the contents A2 to An are preferably 0.05 or more, more preferably 0.1 or more, and further preferably 0.2 or more, and preferably 0.6 or less. In the case where the fibrous carbon nanostructures are multi-walled CNTs, the contents A2 to An are preferably 0.1 or more, more preferably 0.5 or more, and further preferably 1.0 or more, and preferably 3.0 or less.

In particular, regarding the contents A1 to An in the adjacent electromagnetic wave absorption layers, a ratio $(A_{i+1}/A_i)$ is preferably as follows, where $A_i$ and $A_{i+1}$ are the respective fibrous carbon nanostructure contents of any two adjacent electromagnetic wave absorption layers. In the case where the fibrous carbon nanostructures are fibrous carbon nanostructures that exhibit a convex upward shape in a $t$-plot, the ratio $(A_{i+1}/A_i)$ is preferably 1/10 or more and 4/5 or less, and more preferably 1/5 or more and 1/2 or less. In the case where the fibrous carbon nanostructures are multi-walled CNTs, the ratio $(A_{i+1}/A_i)$ is preferably 1/7 or more and 1/2 or less.

Although another layer may be provided between the plurality of electromagnetic wave absorption layers, the electromagnetic wave absorption layers are preferably adjacent to each other. Thus, the electromagnetic wave absorption capacity in a high frequency domain can be further improved.

The fibrous carbon nanostructures contained in the plurality of electromagnetic wave absorption layers are preferably the same. With such a structure, the production efficiency of the electromagnetic wave absorber can be enhanced.

The insulating materials contained in the plurality of electromagnetic wave absorption layers may be the same or different, but are preferably the same. With such a structure, the electromagnetic wave absorption capacity of the electromagnetic wave absorber can be further improved, and the durability of the electromagnetic wave absorber can be enhanced.

[Insulating Layer]

The presently disclosed electromagnetic wave absorber preferably includes an insulating layer at the outermost surface on the electromagnetic wave incidence side. The insulating layer may be any insulating layer having a volume resistivity measured in accordance with JIS K 6911 of $10^{11}$ $\Omega \cdot \text{cm}$ or more. The insulating layer contains an insulating material. The insulating material is not limited, and may be an insulating material that can be blended in the electromagnetic wave absorption material. The insulating material contained in the electromagnetic wave absorption layer and the insulating material contained in the insulating layer may be the same or different. The insulating layer may optionally contain known additives such as those described above with regard to the electromagnetic wave absorption material. Examples of the insulating layer include a polyethylene terephthalate film and a polyimide film.

Such an electromagnetic wave absorber has better electromagnetic wave absorption capacity in a high frequency domain of more than 20 GHz, and has excellent durability in the case where the electromagnetic wave absorber is thin. The versatility of the electromagnetic wave absorber can be enhanced by providing the insulating layer at the outermost surface of the electromagnetic wave absorber.

[Thickness of Electromagnetic Wave Absorber]

—Thickness of Single-Layer Electromagnetic Wave Absorber—

In the case where the presently disclosed electromagnetic wave absorber is single-layer type, the thickness of the electromagnetic wave absorption layer in the single-layer electromagnetic wave absorber is preferably 500 μm or less, more preferably 100 μm or less, particularly preferably 80 μm or less, and further particularly preferably 40 μm or less, and preferably 1 μm or more, and more preferably 10 μm or more. If the thickness of the electromagnetic wave absorber in film form is 500 μm or less, the electromagnetic wave absorption capacity in a high frequency domain can be further enhanced sufficiently. Moreover, the electromagnetic wave absorber in film form with a thickness in the above-mentioned range is usable in various applications, and so has high versatility.

The thickness of the electromagnetic wave absorption material in film form can be freely controlled in a shaping step and the like in the below-mentioned production method. The thickness of the electromagnetic wave absorption material in film form can be measured by the method described in the examples section.

In the case where the presently disclosed electromagnetic wave absorber includes an insulating layer, the total thickness of the presently disclosed electromagnetic wave absorber is preferably 500 μm or less, more preferably 200 μm or less, and further preferably 120 μm or less. The total thickness of the presently disclosed electromagnetic wave absorber may be 100 μm or less. The total thickness of the presently disclosed electromagnetic wave absorber is preferably 1 μm or more, and more preferably 10 μm or more. If the total thickness of the electromagnetic wave absorber is in the above-mentioned range, the electromagnetic wave absorption capacity in a high frequency domain can be sufficiently ensured, and also the free-standing ability as a film can be sufficiently ensured.

—Thickness of Multi-Layer Electromagnetic Wave Absorber—

In the case where the presently disclosed electromagnetic wave absorber is a multi-layer electromagnetic wave absorber, the total thickness of the plurality of electromagnetic wave absorption layers is preferably in the same numeric value range as the single-layer type.

(Production Method for Electromagnetic Wave Absorption Material and Electromagnetic Wave Absorber)

The presently disclosed electromagnetic wave absorption material and electromagnetic wave absorber can be produced through: a step of dispersing fibrous carbon nanostructures and an insulating material in a solvent to obtain an electromagnetic wave absorption material slurry composition (electromagnetic wave absorption material slurry composition production step); and a step of yielding an electromagnetic wave absorption material or an electromagnetic wave absorber from the obtained electromagnetic wave absorption material slurry composition (shaping step).

<Electromagnetic Wave Absorption Material Slurry Composition Production Step>

In the electromagnetic wave absorption material slurry composition production step (hereafter also simply referred to as "slurry composition production step"), the fibrous carbon nanostructures and the insulating material as described above are dispersed in a solvent, to produce an electromagnetic wave absorption material slurry composition (hereafter also simply referred to as "slurry composition").

[Solvent]

In the slurry composition production step, the solvent is not limited. Examples of solvents that can be used include: water; alcohols such as methanol, ethanol, n-propanol, isopropanol, n-butanol, isobutanol, t-butanol, pentanol, hexanol, heptanol, octanol, nonanol, and decanol; ketones such as acetone, methyl ethyl ketone, and cyclohexanone; esters such as ethyl acetate and butyl acetate; ethers such as diethyl ether, dioxane, and tetrahydrofuran; amide-based polar organic solvents such as N,N-dimethylformamide and N-methylpyrrolidone; and aromatic hydrocarbons such as toluene, xylene, chlorobenzene, ortho-dichlorobenzene, and para-dichlorobenzene. One of these solvents may be used individually, or two or more of these solvents may be used as a mixture.

[Additives]

The additives optionally contained in the slurry composition are not limited, and may be additives typically used in the production of a dispersion liquid such as a dispersant. The dispersant used in the slurry composition production step is not limited as long as it is capable of dispersing the fibrous carbon nanostructures and can be dissolved in the above-mentioned solvent, and may be a surfactant.

Examples of the surfactant include sodium dodecylsulfonate, sodium deoxycholate, sodium cholate, and sodium dodecylbenzenesulfonate.

One of these dispersants may be used individually, or two or more of these dispersants may be used as a mixture.

[Dispersion Treatment in Slurry Composition Production Step]

As the dispersion method in the slurry composition production step, a typical dispersion method using a nanomizer, an ultimizer, an ultrasonic disperser, a ball mill, a sand grinder, a dyno-mill, a spike mill, a DCP mill, a basket mill, a paint conditioner, a high-speed stirring device, a high-pressure homogenizer, or the like may be employed without being limited thereto.

—Fibrous Carbon Nanostructure Dispersion Liquid Production Step—

In the slurry composition production step, a step of producing a fibrous carbon nanostructure dispersion liquid beforehand prior to mixing with the insulating material (fibrous carbon nanostructure dispersion liquid production step) is preferably performed. In the fibrous carbon nanostructure dispersion liquid production step, it is preferable to add the fibrous carbon nanostructures to a solvent, and subject a preliminary dispersion liquid obtained through dispersion by a typical dispersion method to dispersion treatment that brings about a cavitation effect or dispersion treatment that brings about a crushing effect described in detail below, to produce a fibrous carbon nanostructure dispersion liquid.

[[Dispersion Treatment that Brings about Cavitation Effect]]

The dispersion treatment that brings about a cavitation effect is a dispersion method that utilizes shock waves caused by the rupture of vacuum bubbles formed in water when high energy is applied to the liquid. This dispersion method can be used to favorably disperse the fibrous carbon nanostructures.

The dispersion treatment that brings about a cavitation effect is preferably performed at a temperature of 50° C. or less, in terms of suppressing a change in concentration due to solvent volatilization. Specific examples of the dispersion treatment that brings about a cavitation effect include dispersion treatment using ultrasound, dispersion treatment using a jet mill, and dispersion treatment using high-shear stirring. One of these dispersion treatments may be carried out or a plurality of these dispersion treatments may be carried out in combination. More specifically, an ultrasonic homogenizer, a jet mill, and a high-shear stirring device are preferably used. Commonly known conventional devices may be used as these devices.

In a situation in which the dispersion of the slurry composition is performed using an ultrasonic homogenizer, the coarse dispersion liquid is irradiated with ultrasound by the ultrasonic homogenizer. The irradiation time may be set as appropriate in consideration of the amount of fibrous carbon nanostructures and so forth.

In a situation in which a jet mill is used, the number of treatment repetitions carried out is set as appropriate in consideration of the amount of fibrous carbon nanostructures and so forth. For example, the number of treatment repetitions is preferably at least 2 repetitions, and more preferably at least 5 repetitions, and is preferably no greater than 100 repetitions, and more preferably no greater than 50 repetitions. Furthermore, the pressure is preferably 20 MPa to 250 MPa, and the temperature is preferably 15° C. to 50° C. In the case where a jet mill is used, a surfactant is preferably added as a dispersant to the solvent. This reduces the viscosity of the treatment liquid, and enables the jet mill to operate stably. An example of such a jet mill is a high-pressure wet jet mill. Specific examples encompass "Nanomaker®" (Nanomaker is a registered trademark in Japan, other countries, or both) (manufactured by Advanced Nano Technology Co., Ltd.), "Nanomizer" (manufactured by Nanomizer Inc.), "NanoVater" (manufactured by Yoshida Kikai Co. Ltd.), and "Nano Jet Pal®" (Nano Jet Pal is a registered trademark in Japan, other countries, or both) (manufactured by Jokoh Co., Ltd.).

In a situation in which high-shear stirring is used, the coarse dispersion liquid is subjected to stirring and shearing using a high-shear stirring device. The rotational speed is preferably as fast as possible. The operating time (i.e., the time during which the device is rotating) is preferably 3 min or more and 4 hr or less, the circumferential speed is preferably 20 m/s or more and 50 m/s or less, and the temperature is preferably 15° C. or more and 50° C. or less. In the case where a high-shear stirring device is used, polysaccharides are preferable as a dispersant. A polysaccharide aqueous solution is highly viscous and therefore high shearing stress can be easily applied. This further facilitates the dispersion. Examples of such a high-shear stirring device encompass: stirrers typified by "Ebara Milder" (manufactured by Ebara Corporation), "CAVITRON" (manufactured by Eurotec Co., Ltd.), and "DRS2000" (manufactured by Ika Works, Inc.); stirrers typified by "CLEARMIX® CLM-0.8S" (CLEARMIX is a registered trademark in Japan, other countries, or both) (manufactured by M Technique Co., Ltd.); turbine-type stirrers typified by "T.K. Homo Mixer" (manufactured by Tokushu Kika Kogyo Co., Ltd.); and stirrers typified by "TK Fillmix" (manufactured by Tokushu Kika Kogyo Co., Ltd.).

The dispersion treatment that brings about a cavitation effect is more preferably performed at a temperature of 50° C. or less. This suppresses a change in concentration due to solvent volatilization.

[[Dispersion Treatment that Brings about Crushing Effect]]

Dispersion treatment that brings about a crushing effect is even more advantageous because, in addition to enabling uniform dispersion of the fibrous carbon nanostructures, dispersion treatment that brings about a crushing effect reduces damage to the fibrous carbon nanostructures due to shock waves when air bubbles burst compared to the above-mentioned dispersion treatment that brings about a cavitation effect.

The dispersion treatment that brings about a crushing effect uniformly disperses the fibrous carbon nanostructures in the solvent by causing crushing and dispersion of the fibrous carbon nanostructures by imparting shear force to the coarse dispersion liquid and by further applying back pressure to the coarse dispersion liquid, while cooling the coarse dispersion liquid as necessary in order to reduce air bubble formation.

When applying back pressure to the coarse dispersion liquid, the back pressure may be applied to the coarse dispersion liquid by lowering pressure at once to atmospheric pressure, yet the pressure is preferably lowered over multiple steps.

In order to further disperse the fibrous carbon nanostructures in the coarse dispersion liquid by applying a shear force to the coarse dispersion liquid, a dispersion system including a disperser with the structure below, for example, may be used.

From the side where the coarse dispersion liquid flows in to the side where the coarse dispersion liquid flows out, the disperser is sequentially provided with a disperser orifice having an inner diameter d1, a dispersion space having an inner diameter d2, and a terminal section having an inner diameter d3 (where d2>d3>d1).

In this disperser, by passing through the disperser orifice, high-pressure (e.g. 10 MPa to 400 MPa, preferably 50 MPa to 250 MPa) coarse dispersion liquid that flows in is reduced in pressure while becoming a high flow rate fluid that then flows into the dispersion space. Subsequently, the high flow rate coarse dispersion liquid that has entered the dispersion space flows in the dispersion space at high speed, receiving a shear force at that time. As a result, the flow rate of the coarse dispersion liquid decreases, and the fibrous carbon nanostructures are dispersed well. A fluid at a lower pressure (back pressure) than the pressure of the in-flowing coarse dispersion liquid then flows out from the terminal section, yielding the dispersion liquid of the fibrous carbon nanostructures.

The back pressure of the coarse dispersion liquid may be applied to the coarse dispersion liquid by applying a load to the flow of the coarse dispersion liquid. For example, a desired back pressure may be applied to the coarse dispersion liquid by providing a multiple step-down device downstream from the disperser.

With this multiple step-down device, the back pressure of the coarse dispersion liquid is lowered over multiple steps, so that when the dispersion liquid of the fibrous carbon nanostructures is ultimately released into atmospheric pressure, the occurrence of air bubbles in the dispersion liquid can be suppressed.

The disperser may be provided with a heat exchanger or a cooling liquid supply mechanism for cooling the coarse dispersion liquid. The reason is that by cooling the coarse dispersion liquid that is at a high temperature due to the application of a shear force in the disperser, the generation of air bubbles in the coarse dispersion liquid can be further suppressed.

Instead of providing a heat exchanger or the like, the generation of air bubbles in the solvent containing the fibrous carbon nanostructures can also be suppressed by cooling the coarse dispersion liquid in advance.

As described above, in this dispersion treatment that brings about a crushing effect, the occurrence of cavitation can be suppressed, thereby suppressing damage to the fibrous carbon nanostructures due to cavitation, which is sometimes a concern. In particular, damage to the fibrous carbon nanostructures due to shock waves when the air bubbles burst can be suppressed. Additionally, adhesion of air bubbles to the fibrous carbon nanostructures and energy loss due to the generation of air bubbles can be suppressed, and the fibrous carbon nanostructures can also be effectively dispersed evenly.

In particular, as dispersion treatment in the production of the fibrous carbon nanostructure dispersion liquid, dispersion treatment that uses a dispersion treatment device including a thin-tube flow path and transfers the coarse dispersion liquid to the thin-tube flow path to apply shear force to the coarse dispersion liquid and thereby disperse the fibrous carbon nanostructures is preferable. By transferring the coarse dispersion liquid to the thin-tube flow path and applying shear force to the coarse dispersion liquid to disperse the fibrous carbon nanostructures, the fibrous carbon nanostructures can be dispersed favorably while preventing damage to the fibrous carbon nanostructures.

Examples of a dispersion system having the above structure include the product name "BERYU SYSTEM PRO" (manufactured by BeRyu Corporation). Dispersion treatment that brings about a crushing effect may be performed by using such a dispersion system and appropriately controlling the dispersion conditions.

Known additives as described above may be optionally added to the slurry composition obtained in this way, depending on the intended use of the electromagnetic wave absorption material. The mixing time in this case is preferably 10 min or more and 24 hr or less.

—Insulating Material Dispersion Liquid Production Step—

In the slurry composition production step, it is preferable to produce an insulating material dispersion liquid beforehand by adding the above-mentioned insulating material to the above-mentioned solvent and performing dispersion treatment, prior to mixing with the fibrous carbon nanostructures. The dispersion treatment method may be the above-mentioned typical dispersion method.

In the production of the electromagnetic wave absorption material slurry composition, a resin latex may be used instead of the dispersion liquid obtained by adding the insulating material to the solvent. For example, the resin latex may be obtained by any of the following methods: (1) a method in which a solution of a resin dissolved in an organic solvent is emulsified in water optionally in the presence of a surfactant, and the organic solvent is then removed as necessary to yield the latex; and (2) a method in which a monomer for forming a resin is emulsion polymerized or suspension polymerized to directly yield the latex. An insulating filler may be added to such a resin latex as necessary. The resin may be uncrosslinked or crosslinked. An organic solvent used in the production of the latex is not limited as long as it can be mixed with the fibrous carbon nanostructure dispersion liquid obtained as described above, and may be a typical organic solvent. Although no specific limitations are placed on the solid content concentration in the latex, the concentration is preferably 20 mass % or more and more preferably 60 mass % or more, and more preferably 80 mass % or less, from a viewpoint of achieving homogeneous dispersion in the latex.

<Shaping Step>

The shaping method in the shaping step may be selected as appropriate depending on, for example, the intended use and the type of the insulating material used. Examples of the shaping method include a film formation method by application, and a shaping method to a desired shape.

The electromagnetic wave absorption material and the electromagnetic wave absorber obtained as described below contain the fibrous carbon nanostructures in a state of being approximately uniformly dispersed in a matrix made of the insulating material. The electromagnetic wave absorption material and the electromagnetic wave absorber may be optionally subjected to crosslinking treatment.

[Film Formation Method]

In the shaping step, any known film formation method may be used for film formation (formation) of the electromagnetic wave absorption material in film form (layer form) from the above-mentioned slurry composition. By film-forming the electromagnetic wave absorption material in layer form, an electromagnetic wave absorption layer can be yielded. An electromagnetic wave absorption layer can be obtained by film-forming a material containing fibrous carbon nanostructures and insulating resin.

For example, the slurry composition is applied onto a known film formation substrate that can constitute the above-mentioned insulating layer such as a polyethylene terephthalate (PET) film or a polyimide film and then dried, to remove the solvent from the slurry composition. The application is not limited, and may be performed by a known method such as brush coating or casting. The drying may be performed by a known method such as drying in a vacuum or being left to stand in a draft.

The single-layer electromagnetic wave absorber can be produced through such a film formation method.

—Formation of Multi-Layer Electromagnetic Wave Absorber—

The multi-layer electromagnetic wave absorber can be produced in the following manner.

For example, in the electromagnetic wave absorption material slurry composition production step, a plurality of types of slurry compositions produced in desired blending amounts for multi-layer formation are applied onto a known film formation substrate by a known method. The multi-layer electromagnetic wave absorber can thus be formed. In more detail, for example, one slurry composition is applied onto a PET film constituting an insulating layer and dried to form one electromagnetic wave absorption layer first. After this, another slurry composition is applied onto the electromagnetic wave absorption layer and dried to form another electromagnetic wave absorption layer. Thus, a multi-layer electromagnetic wave absorber including two electromagnetic wave absorption layers and an insulating layer at its outermost layer can be produced. The application and drying methods are not limited, and typical methods as described above may be used.

[Shaping Method to Desired Shape]

It is also possible to shape the electromagnetic wave absorption material which has been made solid through a well-known coagulation method or drying method into a desired shape. Examples of coagulation methods that can coagulate the slurry composition include a method in which the electromagnetic wave absorption material is added to a water-soluble organic solvent, a method in which an acid is added to the electromagnetic wave absorption material, and a method in which salt is added to the electromagnetic wave absorption material. The water-soluble organic solvent is preferably a solvent in which the insulating material in the slurry composition is not dissolved whereas the dispersant is dissolved. Examples of such an organic solvent include methanol, ethanol, 2-propanol, and ethylene glycol. Examples of the acid include acids typically used for latex coagulation, such as acetic acid, formic acid, phosphoric acid, and hydrochloric acid. Examples of the salt include well-known salts typically used for latex coagulation, such as sodium chloride, aluminum sulfate, and potassium chloride.

The electromagnetic wave absorption material obtained by coagulation or drying can be shaped by use of a forming machine suitable for a desired shape of a shaped item, such as a punching machine, an extruder, an injection machine, a compressor, or a roller.

EXAMPLES

The following provides a more specific description of the present disclosure based on examples. However, the present disclosure is not limited to the following examples. In the following description, "%" and "parts" used in expressing quantities are by mass, unless otherwise specified.

In Examples and Comparative Examples, the following methods were used in order to measure or evaluate the BET specific surface area, the t-plot, the tensile breaking strength, the tensile breaking strain, the flexibility of the electromagnetic wave absorption material, the thickness of the electromagnetic wave absorption layer(s) included in the electromagnetic wave absorber, the reflection attenuation amount (dB) of the electromagnetic wave absorber, and the transmission attenuation amount (dB) of the electromagnetic wave absorber.

<BET Specific Surface Area>

The BET specific surface area of the fibrous carbon nanostructures used in each of Examples and Comparative Examples was measured as follows.

A cell for dedicated use in a fully automated specific surface area analyzer (manufactured by Mountech Co., Ltd., "Macsorb® HM model-1210" (Macsorb is a registered trademark in Japan, other countries, or both)) was thermally treated at 110° C. for 5 hr or more to be sufficiently dried. Into the cell was put 20 mg of fibrous carbon nanostructures measured on a scale. The cell was then placed at a predetermined location of the analyzer, and the BET specific surface area was automatically measured. The analyzer measures a specific surface area on a principle that it finds an adsorption and desorption isotherm of liquid nitrogen at 77K and measures the specific surface area from the adsorption and desorption isotherm according to Brunauer-Emmett-Teller (BET) method.

<t-Plot>

The t-plot of the fibrous carbon nanostructures used in each of Examples and Comparative Examples was measured as follows.

The t-plot was created from the adsorption isotherm obtained in the measurement of the BET specific surface area by converting the relative pressure to an average thickness t (nm) of an adsorbed layer of nitrogen gas. The measurement principle of the t-plot complies with the t-plot method of de Boer et al.

<Durability of Thermoplastic Resin and/or Thermosetting Resin as Insulating Material and Electromagnetic Wave Absorption Material Using Thermoplastic Resin and/or Thermosetting Resin>

The tensile breaking strength and tensile breaking strain of a strip sample piece for insulating material tensile testing and a strip sample piece for electromagnetic wave absorption material tensile testing produced in each of Examples and Comparative Examples were measured as follows.

In accordance with JIS K 7127, after forming a strip sheet having a sample piece with a thickness of 200 μm, a width of 10 mm, and a length of 200 mm on a polyimide film (manufactured by DuPont-Toray Co., Ltd., "Kapton 100H Type") with a thickness of 25 μm, the sample piece from which the polyimide film had been removed was measured under the conditions of 25° C. and a tension rate of 5.0 mm/min, using a tensile tester (manufactured by Shimadzu Corporation, "AUTOGRAPH AGS-X").

Moreover, the change rate of tensile breaking strength (%) and the change rate of tensile breaking strain (%) were calculated according to the following formula:

change rate (%)={((value of strip sample piece for electromagnetic wave absorption material tensile testing)/(value of strip sample piece for insulating material tensile testing))×100}−100.

The durability was then evaluated based on the following evaluation criteria:

A: change rates of values of tensile breaking strength and tensile breaking strain being −20% or more B: change rate of value of tensile breaking strength or tensile breaking strain being less than −20%.

<Flexibility of Electromagnetic Wave Absorption Material Using Rubber and/or Elastomer as Insulating Material>

Part of the slurry composition produced in each of Examples and Comparative Examples was put into a container equipped with a stirrer, and the organic solvent was volatilized by natural drying while stirring. The solid content was taken out of the container, and then dried in a vacuum at 60° C. for 24 hr or more, thus obtaining an electromagnetic wave absorption material. The obtained electromagnetic wave absorption material was shaped in a JIS No. 3 dumbbell in accordance with JIS K 6251, to obtain a specimen. The obtained specimen was subjected to a tensile test in accordance with JIS K 6251 with a tension rate of 500±50 mm/min, using a tensile tester (manufactured by Shimadzu Corporation, "AUTOGRAPH AGS-X"). The value of tensile breaking strain (%), which is a value representing, in percentage, a result of dividing the length of the specimen upon a break (cut) of the specimen by the original length of the specimen, was evaluated based on the following criteria. A higher value of tensile breaking strain indicates higher flexibility.

Example 2-1 to Comparative Example 2-4

A: value of tensile breaking strain being 150% or more

B: value of tensile breaking strain being less than 150%

Example 3-1 to Comparative Example 3-4

A: value of tensile breaking strain being 200% or more

B: value of tensile breaking strain being 100% or more and less than 200%

C: value of tensile breaking strain being less than 100%.

<Thickness of Electromagnetic Wave Absorption Layer>

A micrometer (manufactured by Mitutoyo Corporation, 293 series, "MDH-25") was used to measure thickness at ten points for the electromagnetic wave absorber produced in each of Examples and Comparative Examples, and the thickness 38 μm of the PET film (forming the insulating layer) used as a substrate was subtracted from an average value of the measurements, to determine the thickness of the electromagnetic wave absorption layer.

<Electromagnetic Wave Absorption Performance of Electromagnetic Wave Absorber>

The electromagnetic wave absorption performance of the electromagnetic wave absorber was evaluated by measuring the electromagnetic wave reflection attenuation amount (dB).

The electromagnetic wave absorber produced in each of Examples and Comparative Examples was attached, as a specimen, to a conductive metal plate so that the electromagnetic wave absorber layer side higher in fibrous carbon nanostructure concentration faced the conductive metal plate. In other words, the electromagnetic wave absorber was placed so that an electromagnetic wave was incident on the insulating layer side of the electromagnetic wave absorber when attaching the conductive metal plate to a measurement system.

A measurement system (manufactured by KEYCOM Co., Ltd., "DPS10") was used to measure S (Scattering) parameter (S11) with one port by the free space method. The measurement was performed for frequencies of 60 GHz to 90 GHz. As the measurement system, a vector network analyzer (manufactured by Anritsu Corporation, "ME7838A") and an antenna (part number "RH15S10" and "RH10S10") were employed. Tables 1 to 3 show the results (absolute values) of calculating the reflection attenuation amount (dB) according to the following Formula (1) based on S parameter (S11) when irradiating an electromagnetic wave of 60 GHz and 76 GHz. A higher reflection attenuation amount indicates better electromagnetic wave absorption performance.

$$\text{Reflection attenuation amount (dB)} = 20 \log |S11| \quad (1).$$

<Electromagnetic Wave Shield Performance of Electromagnetic Wave Absorber>

The electromagnetic wave shield performance of the electromagnetic wave absorber was evaluated by measuring the electromagnetic wave transmission attenuation amount (dB).

The transmission attenuation amount of the electromagnetic wave absorber produced in each of Examples and Comparative Examples was calculated as follows: Under the same test conditions as the above-mentioned reflection attenuation amount measurement except that the electromagnetic wave absorber was installed in the measurement system by the free space method without being attached to a conductive metal plate, S21 parameter was measured, and the transmission attenuation amount (dB) was calculated according to the following Formula (2). A higher transmission attenuation amount indicates better electromagnetic wave shield performance.

The electromagnetic wave shield performance is shield performance by reflecting and absorbing an electromagnetic wave. Thus, the electromagnetic wave shield performance is different from electromagnetic wave absorption performance that represents a property of removing an electromagnetic wave by absorbing the electromagnetic wave and converting it into heat energy.

$$\text{Transmission attenuation amount (dB)} = 20 \log |S21| \quad (2).$$

Example 1-1

Carbon nanotubes (SGCNTs) obtained by the super growth method described in JP 4,621,896 B2 were taken to be fibrous carbon nanostructures that exhibit a convex upward shape in a t-plot. Specifically, SGCNTs were synthesized on the following conditions:

Carbon compound: ethylene (feeding rate: 50 sccm)
Atmosphere (gas) (Pa): mixed gas of helium and hydrogen (feeding rate: 1000 sccm)
Pressure: 1 atmospheric pressure
Amount of water vapor added (ppm): 300 ppm
Reaction temperature (° C.): 750° C.
Reaction time (min): 10 min
Metal catalyst (amount of presence): iron thin film (thickness: 1 nm)
Substrate: silicon wafer.

The obtained SGCNTs had a BET specific surface area of 880 $m^2/g$, and exhibited a convex upward shape in a t-plot. Upon measuring with a Raman spectrometer, spectra of a Radial Breathing Mode (RBM) were observed in a low-wavenumber region of 100 $cm^{-1}$ to 300 $cm^{-1}$, which is characteristic of single-walled carbon nanotubes.

The synthesized SGCNTs were added to a chloroform solvent so as to have a concentration of 0.2%, and stirred with a magnetic stirrer for 24 hr to carry out preliminary dispersion of the SGCNTs.

Next, the coarse dispersion liquid was charged into a multistage step-down high-pressure homogenizer (manufactured by Beryu Corporation, "BERYU SYSTEM PRO") having a multistage pressure controller (multistage step-down transformer) connected to a high-pressure dispersion treatment portion (jet mill) having a thin-tube flow path portion with a diameter of 200 μm, and a pressure of 120 MPa was applied to the coarse dispersion liquid intermittently and instantaneously, to transfer the coarse dispersion liquid into the thin-tube flow path and disperse it. A fibrous carbon nanostructure dispersion liquid was thus obtained.

Apart from this, polycarbonate (PC) (manufactured by Idemitsu Kosan Co. Ltd., "TARFLON A1900") was added to a chloroform solvent so as to have a concentration of 2%, and sufficiently stirred to produce an insulating polymer dispersion liquid. The insulating polymer dispersion liquid was repeatedly applied onto a polyimide film and dried, to produce a strip sample piece for insulating polymer tensile testing. The strip sample piece was subjected to a tensile test.

Next, the fibrous carbon nanostructure dispersion liquid and the insulating polymer dispersion liquid were mixed so that the SGCNTs were 0.3 parts relative to 100 parts of the PC as an insulating material in solid content ratio, to produce a slurry composition as an electromagnetic wave absorption material. The slurry composition was repeatedly applied onto a polyimide film and dried, to produce a strip sample piece for electromagnetic wave absorption material tensile testing. The strip sample piece was subjected to a tensile test.

Following this, an electromagnetic wave absorber was produced. The slurry composition was applied to a support film (polyimide film with a thickness of 25 μm) as an insulating layer. After this, natural drying was performed at 25° C. for 1 week or more in a draft of a constant-temperature environment including a local exhaust ventilation system, to sufficiently volatilize the organic solvent and form a thin film layer of the electromagnetic wave absorption material on the polyimide film. An electromagnetic wave absorber including the polyimide film in an insulating layer (surface layer) and the SGCNTs and the PC in an electromagnetic wave absorption layer was thus produced.

The results of the evaluations using the obtained electromagnetic wave absorption material and electromagnetic wave absorber are shown in Table 1. The results of measuring the transmission attenuation amount for the electromagnetic wave absorber by the above-mentioned method were 5 dB at 60 GHz and 5 dB at 76 GHz.

Example 1-2

The SGCNTs synthesized in Example 1-1 were added to a cyclohexane solvent so as to have a concentration of 0.2%, and stirred with a magnetic stirrer for 24 hr to carry out preliminary dispersion of the SGCNTs.

Next, the coarse dispersion liquid was charged into a multistage step-down high-pressure homogenizer (manufactured by Beryu Corporation, "BERYU SYSTEM PRO") having a multistage pressure controller (multistage step-down transformer) connected to a high-pressure dispersion treatment portion (jet mill) having a thin-tube flow path portion with a diameter of 200 μm, and a pressure of 120 MPa was applied to the coarse dispersion liquid intermittently and instantaneously, to transfer the coarse dispersion liquid into the thin-tube flow path and disperse it. A fibrous carbon nanostructure dispersion liquid was thus obtained.

Apart from this, polycycloolefin resin (PCO) (manufactured by Zeon Corporation, "ZEONOR 1020R") was added to a cyclohexane solvent so as to have a concentration of 2%, and sufficiently stirred to produce an insulating polymer dispersion liquid. The insulating polymer dispersion liquid was repeatedly applied onto a polyimide film and dried, to produce a strip sample piece for insulating polymer tensile testing. The strip sample piece was subjected to a tensile test.

Next, the fibrous carbon nanostructure dispersion liquid and the insulating polymer dispersion liquid were mixed so that the SGCNTs were 0.5 parts relative to 100 parts of the PCO in solid content ratio, to produce a slurry composition as an electromagnetic wave absorption material. The slurry composition was repeatedly applied onto a polyimide film and dried, to produce a strip sample piece for electromagnetic wave absorption material tensile testing. The strip sample piece was subjected to a tensile test.

Following this, an electromagnetic wave absorber was produced. The slurry composition was applied to a support film (polyimide film with a thickness of 25 μm) as an insulating layer. After this, natural drying was performed at 25° C. for 1 week or more in a draft of a constant-temperature environment including a local exhaust ventilation system, to sufficiently volatilize the organic solvent and form a thin film layer of the electromagnetic wave absorption material on the polyimide film. An electromagnetic wave absorber including the polyimide film in an insulating layer (surface layer) and the SGCNTs and the PC in an electromagnetic wave absorption layer was thus produced.

The results of the evaluations using the obtained electromagnetic wave absorption material and electromagnetic wave absorber are shown in Table 1. The results of measuring the transmission attenuation amount for the electromagnetic wave absorber by the above-mentioned method were 7 dB at 60 GHz and 7 dB at 76 GHz.

Example 1-3

A metallic mold for molded material with a thickness of 200 μm, a width of 100 mm, and a length of 200 mm was provided on a polyimide film. An epoxy mixed solution prepared by blending 33 parts of an epoxy curing agent (manufactured by Mitsubishi Chemical Corporation, "jER Cure LV11") with 100 parts of epoxy resin (manufactured by Mitsubishi Chemical Corporation, "jER828") was charged into the mold, and left to stand at 25° C. for 24 hr. Subsequently, the epoxy mixed solution was thermally cured at 80° C. for 24 hr, to form an epoxy resin sheet with a thickness of 200 μm, a width of 100 mm, and a length of 200 mm. The sheet was cut into a strip with a width of 10 mm and a length of 200 mm, to produce a strip sample piece for insulating polymer tensile testing. The strip sample piece was subjected to a tensile test.

0.8 parts of the SGCNTs synthesized in Example 1-1 were added to 100 parts of the liquid epoxy resin mentioned above, and the mixture was charged into a thin-film spin disperser (manufactured by PRIMIX, "FILMIX Model 50-50") and subjected to dispersion mixing treatment at 20° C. with a shear rate of 50 m/s for 5 min, to produce a CNT dispersion epoxy resin solution. Further, 33 parts of the epoxy curing agent mentioned above was added to 100 parts of the CNT dispersion epoxy resin solution, to produce a slurry composition. A metallic mold for molded material with a thickness of 200 μm, a width of 100 mm, and a length of 200 mm was provided on a polyimide film. The slurry composition was charged into the mold, and left to stand at 25° C. for 24 hr. Subsequently, the slurry composition was thermally cured at 80° C. for 24 hr, to form a sheet with a thickness of 200 μm, a width of 100 mm, and a length of 200 mm. The sheet was cut into a strip with a width of 10 mm and a length of 200 mm, to produce a strip sample piece for electromagnetic wave absorption material tensile testing. The strip sample piece was subjected to a tensile test.

Following this, an electromagnetic wave absorber was produced. The slurry composition was applied to a support film (polyimide film with a thickness of 25 μm) as an insulating layer. After this, natural curing was performed at 25° C. for 1 week or more in a draft of a constant-temperature environment including a local exhaust ventilation system, to form a thin film layer of the electromagnetic wave absorption material on the polyimide film. An electromagnetic wave absorber including the polyimide film in an insulating layer (surface layer) and the SGCNTs and the epoxy resin in an electromagnetic wave absorption layer was thus produced.

The results of the evaluations using the obtained electromagnetic wave absorption material and electromagnetic wave absorber are shown in Table 1. The results of measuring the transmission attenuation amount for the electromagnetic wave absorber by the above-mentioned method were 10 dB at 60 GHz and 9 dB at 76 GHz.

Example 1-4

A metallic mold for molded material with a thickness of 200 μm, a width of 100 mm, and a length of 200 mm was provided on a polyimide film. PTFE resin (manufactured by Daikin Industries, Ltd., "Polyflon PTFE-M12") was charged into the mold, and subjected to preliminary compression molding in a compression molding machine at 25° C. and 70 MPa. Subsequently, the polyimide film was removed, and sintering was performed at 360° C. for 30 min in an electric furnace in a nitrogen atmosphere, to form a PTFE resin sheet with a thickness of 200 μm, a width of 100 mm, and a length of 200 mm. The sheet was cut into a strip with a width of 10 mm and a length of 200 mm, to produce a strip sample piece for insulating polymer tensile testing. The strip sample piece was subjected to a tensile test.

The SGCNTs synthesized in Example 1-1 were added to a cyclohexane solvent so as to have a concentration of 0.2%, and stirred with a magnetic stirrer for 24 hr to carry out preliminary dispersion of the SGCNTs.

Next, the coarse dispersion liquid was charged into a multistage step-down high-pressure homogenizer (manufactured by Beryu Corporation, "BERYU SYSTEM PRO") having a multistage pressure controller (multistage step-down transformer) connected to a high-pressure dispersion treatment portion having a thin-tube flow path portion with a diameter of 200 μm, and a pressure of 120 MPa was applied to the coarse dispersion liquid intermittently and instantaneously, to transfer the coarse dispersion liquid into the thin-tube flow path and disperse it. A fibrous carbon nanostructure dispersion liquid was thus obtained.

Apart from this, PTFE resin was added to a cyclohexane solvent so as to have a concentration of 5%, thus producing a PTFE resin suspension. After this, the fibrous carbon nanostructure dispersion liquid and the PTFE resin suspension were mixed so that the SGCNTs were 0.5 parts relative to 100 parts of the PTFE resin. The mixture was charged into a thin-film spin disperser and subjected to dispersion mixing treatment at 20° C. with a shear rate of 50 m/s for 5 min. The resultant solution was charged into a conical dryer, and rotationally stirred at a temperature of 80° C. to sufficiently volatilize the solvent, thus producing an electromagnetic wave absorption material (mixed solid powder of SGCNTs and PTFE resin). A metallic mold for molded material with a thickness of 200 μm, a width of 100 mm, and a length of 200 mm was provided on a polyimide film. The electromagnetic wave absorption material was charged into the mold, and subjected to preliminary compression molding in a compression molding machine at 25° C. and 70 MPa. Subsequently, the polyimide film was removed, and sintering was performed at 360° C. for 30 min in an electric furnace in a nitrogen atmosphere, to form a sheet with a thickness of 200 μm, a width of 100 mm, and a length of 200 mm. The sheet was cut into a strip with a width of 10 mm and a length of 200 mm, to produce a strip sample piece for electromagnetic wave absorption material tensile testing. The strip sample piece was subjected to a tensile test.

Following this, an electromagnetic wave absorber was produced. The electromagnetic wave absorption material was placed on a support film (polyimide film with a thickness of 25 μm), and subjected to preliminary compression molding in a compression molding machine at 25° C. and 70 MPa. Subsequently, the polyimide film was removed, and sintering was performed at 360° C. for 30 min in an electric furnace in a nitrogen atmosphere, to produce an electromagnetic wave absorber.

The results of the evaluations using the obtained electromagnetic wave absorption material and electromagnetic wave absorber are shown in Table 1. The transmission attenuation amount of the obtained electromagnetic wave absorber was 8 dB at 60 GHz and 7 dB at 76 GHz.

Example 1-5

In the same way as in Example 1-1, the fibrous carbon nanostructure dispersion liquid and the insulating polymer dispersion liquid were mixed so that the SGCNTs were 0.1 parts relative to 100 parts of the PC in solid content ratio, to produce a slurry composition 1-2. Moreover, the fibrous carbon nanostructure dispersion liquid and the insulating polymer dispersion liquid were mixed so that the SGCNTs were 0.3 parts relative to 100 parts of the PC in solid content ratio, to produce a slurry composition 1-1.

Following this, the slurry composition 1-2 was applied to a support film (polyimide film with a thickness of 25 μm) as an insulating layer. After this, natural drying was performed at 25° C. for 1 week or more in a draft of a constant-temperature environment including a local exhaust ventilation system, to sufficiently volatilize the organic solvent and form a second electromagnetic wave absorption layer containing 0.1 parts of SGCNTs on the polyimide film. The thickness of the second electromagnetic wave absorption layer was measured.

Furthermore, the slurry composition 1-1 was applied to the surface of the second electromagnetic wave absorption layer. After this, natural drying was performed at 25° C. for 1 week or more in a draft of a constant-temperature environment including a local exhaust ventilation system, to sufficiently volatilize the organic solvent and form a first electromagnetic wave absorption layer. Thus, a multi-layer electromagnetic wave absorber composed of the surface layer (insulating layer), the second electromagnetic wave absorption layer, and the first electromagnetic wave absorption layer was produced.

The results of the evaluations using the obtained electromagnetic wave absorption material and electromagnetic wave absorber are shown in Table 1. Here, the thickness of the first electromagnetic wave absorption layer was calculated by subtracting the thicknesses of the insulating layer and the second electromagnetic wave absorption layer from the total thickness. The transmission attenuation amount of the obtained electromagnetic wave absorber was 6 dB at 60 GHz and 6 dB at 76 GHz.

A strip sample piece for insulating polymer tensile testing and a strip sample piece for electromagnetic wave absorption material tensile testing were produced in the same way as in Example 1-1.

Comparative Example 1-1

An electromagnetic wave absorption material and an electromagnetic wave absorber were produced in the same way as in Example 1-1, except that the fibrous carbon nanostructure dispersion liquid and the insulating polymer dispersion liquid were mixed so that the SGCNTs were 0.1 parts relative to 100 parts of the PC in solid content ratio, and a layer with a thickness of 60 was formed.

A strip sample piece for insulating polymer tensile testing was produced in the same way as in Example 1-1. A strip sample piece for electromagnetic wave absorption material tensile testing was produced by repeatedly applying, on a polyimide film, the mixed solution containing 0.1 parts of the SGCNTs relative to 100 parts of the PC obtained above and drying it.

The results of the evaluations using the obtained electromagnetic wave absorption material and electromagnetic wave absorber are shown in Table 1. The transmission attenuation amount of the obtained electromagnetic wave absorber was 1 dB at 60 GHz and 1 dB at 76 GHz.

Comparative Example 1-2

An electromagnetic wave absorption material and an electromagnetic wave absorber were produced in the same way as in Example 1-1, except that the fibrous carbon nanostructure dispersion liquid and the insulating polymer dispersion liquid were mixed so that the SGCNTs were 5 parts relative to 100 parts of the PC in solid content ratio, and a layer with a thickness of 80 μm was formed.

A strip sample piece for insulating polymer tensile testing was produced in the same way as in Example 1-1. A strip sample piece for electromagnetic wave absorption material tensile testing was produced by repeatedly applying, on a polyimide film, the mixed solution containing 5 parts of the SGCNTs relative to 100 parts of the PC obtained above and drying it.

The results of the evaluations using the obtained electromagnetic wave absorption material and electromagnetic wave absorber are shown in Table 1. The transmission attenuation amount of the obtained electromagnetic wave absorber was 22 dB at 60 GHz and 22 dB at 76 GHz.

Comparative Example 1-3

An electromagnetic wave absorption material and an electromagnetic wave absorber were produced in the same way as in Example 1-2, except that the fibrous carbon nanostructure dispersion liquid and the insulating polymer dispersion liquid were mixed so that the SGCNTs were 5 parts relative to 100 parts of the PCO in solid content ratio, and a layer with a thickness of 60 µm was formed.

A strip sample piece for insulating polymer tensile testing was produced in the same way as in Example 1-2. A strip sample piece for electromagnetic wave absorption material tensile testing was produced by repeatedly applying, on a polyimide film, the mixed solution containing 5 parts of the SGCNTs relative to 100 parts of the PCO obtained above and drying it.

The results of the evaluations using the obtained electromagnetic wave absorption material and electromagnetic wave absorber are shown in Table 1. The transmission attenuation amount of the obtained electromagnetic wave absorber was 23 dB at 60 GHz and 21 dB at 76 GHz.

Comparative Example 1-4

An electromagnetic wave absorption material and an electromagnetic wave absorber were produced in the same way as in Example 1-1, except that multi-walled carbon nanotubes (MWCNTs) (manufactured by Nanocyl, "Nanocyl® NC 7000" (Nanocyl is a registered trademark in Japan, other countries, or both)) were used as fibrous carbon nanostructures instead of SGCNTs, the fibrous carbon nanostructure dispersion liquid and the insulating polymer dispersion liquid were mixed so that the MWCNTs was 0.3 parts relative to 100 parts of the PC in solid content ratio, and a layer with a thickness of 60 µm was formed.

A strip sample piece for insulating polymer tensile testing was produced in the same way as in Example 1-1. A strip sample piece for electromagnetic wave absorption material tensile testing was produced by repeatedly applying, on a polyimide film, the mixed solution containing 0.3 parts of the MWCNTs relative to 100 parts of the PC obtained above and drying it.

The results of the evaluations using the obtained electromagnetic wave absorption material and electromagnetic wave absorber are shown in Table 1. The transmission attenuation amount of the obtained electromagnetic wave absorber was 3 dB at 60 GHz and 2 dB at 76 GHz.

In Table 1, "PC" denotes polycarbonate, "PCO" denotes polycycloolefin resin, and "PTFE" denotes polytetrafluoroethylene resin.

TABLE 1

| | | | Example 1-1 | Example 1-2 | Example 1-3 | Example 1-4 | Example 1-5 |
|---|---|---|---|---|---|---|---|
| Electromagnetic wave absorption material | Insulating material | Thermoplastic/thermosetting resin type | PC | PCO | Epoxy | PTFE | PC |
| | Fibrous carbon nanostructures | Type | SGCNT | SGCNT | SGCNT | SGCNT | SGCNT |
| | | t-plot | Convex upward | Convex upward | Convex upward | Convex upward | Convex upward |
| | | BET specific surface area [$m^2/g$] | 880 | 880 | 880 | 880 | 880 |
| | | Content [parts by mass] | 0.3 | 0.5 | 0.8 | 0.5 | 0.3 |
| Electromagnetic wave absorber | Insulating layer | Type | Polyimide film | Polyimide film | Polyimide film | — | Polyimide film |
| | | Layer thickness [µm] | 25 | 25 | 25 | — | 25 |
| | Second electromagnetic wave absorption layer | Fibrous carbon nanostructures | — | — | — | — | SGCNT |
| | | Content [parts by mass] | — | — | — | — | 0.1 |
| | | Layer thickness [µm] | — | — | — | — | 30 |
| | First electromagnetic wave absorption layer | Fibrous carbon nanostructures | SGCNT | SGCNT | SGCNT | SGCNT | SGCNT |
| | | Content [parts by mass] | 0.3 | 0.5 | 0.8 | 0.5 | 0.3 |
| | | Thickness [µm] | 55 | 34 | 29 | 98 | 31 |
| | Total thickness (µm) | | 80 | 59 | 54 | 98 | 86 |
| Evaluation | Electromagnetic wave absorption capacity | 60 GHz [dB] | 13 | 13 | 12 | 11 | 13 |
| | | 76 GHz [dB] | 12 | 11 | 11 | 10 | 13 |
| | Durability | Insulating material Tensile breaking strength [MPa] | 65 | 53 | 58 | 30 | 65 |
| | | Tensile breaking strain [%] | 95 | 90 | 4 | 250 | 95 |
| | | Electromagnetic wave absorption material Tensile breaking strength [MPa] | 68 | 55 | 60 | 25 | 68 |
| | | Tensile breaking strain [%] | 90 | 80 | 4 | 280 | 90 |
| | | Change rate of tensile breaking strength [%] | 5 | 4 | 3 | −17 | 5 |
| | | Change rate of tensile breaking strain [%] | −5 | −11 | 0 | 12 | −5 |
| | | Durability | A | A | A | A | A |

TABLE 1-continued

| | | | Comparative Example 1-1 | Comparative Example 1-2 | Comparative Example 1-3 | Comparative Example 1-4 |
|---|---|---|---|---|---|---|
| Electromagnetic wave absorption material | Insulating material | Thermoplastic/thermosetting resin type | PC | PC | PCO | PC |
| | Fibrous carbon nanostructures | Type | SGCNT | SGCNT | SGCNT | MWCNT |
| | | t-plot | Convex upward | Convex upward | Convex upward | Convex downward |
| | | BET specific surface area [m$^2$/g] | 880 | 880 | 880 | 265 |
| | | Content [parts by mass] | 0.1 | 5 | 5 | 0.3 |
| Electromagnetic wave absorber | Insulating layer | Type | Polyimide film | Polyimide film | Polyimide film | Polyimide film |
| | | Layer thickness [μm] | 25 | 25 | 25 | 25 |
| | Second electromagnetic wave absorption layer | Fibrous carbon nanostructures | — | — | — | — |
| | | Content [parts by mass] | — | — | — | — |
| | | Layer thickness [μm] | — | — | — | — |
| | First electromagnetic wave absorption layer | Fibrous carbon nanostructures | SGCNT | SGCNT | SGCNT | MWCNT |
| | | Content [parts by mass] | 0.1 | 5 | 5 | 0.3 |
| | | Thickness [μm] | 60 | 80 | 60 | 60 |
| Evaluation | Total thickness (μm) | | 85 | 105 | 85 | 85 |
| | Electromagnetic wave absorption capacity | 60 GHz [dB] | 3 | 1 | 1 | 2 |
| | | 76 GHz [dB] | 4 | 1 | 1 | 2 |
| | Durability | Insulating material Tensile breaking strength [MPa] | 65 | 65 | 53 | 65 |
| | | Tensile breaking strain [%] | 95 | 95 | 90 | 95 |
| | | Electromagnetic wave absorption material Tensile breaking strength [MPa] | 65 | 50 | 36 | 66 |
| | | Tensile breaking strain [%] | 95 | 55 | 40 | 95 |
| | | Change rate of tensile breaking strength [%] | 0 | −23 | −32 | 2 |
| | | Change rate of tensile breaking strain [%] | 0 | −42 | −56 | 0 |
| | | Durability | A | B | B | A |

Example 2-1

SGCNTs synthesized in the same way as in Example 1-1 were added to a methyl ethyl ketone solvent so as to have a concentration of 0.2%, and stirred with a magnetic stirrer for 24 hr to carry out preliminary dispersion of the SGCNTs.

Next, the same dispersion treatment as in Example 1-1 was performed. A fibrous carbon nanostructure dispersion liquid was thus obtained.

Apart from this, uncrosslinked fluororubber (manufactured by DuPont, "Viton GBL200S") as an insulating polymer was added to a methyl ethyl ketone solvent so as to have a concentration of 2%, and sufficiently stirred to produce an insulating polymer solution.

The fibrous carbon nanostructure dispersion liquid and the insulating polymer solution were mixed so that the SGCNTs were 0.3 parts relative to 100 parts of the fluororubber in solid content ratio, to produce a slurry composition.

Following this, an electromagnetic wave absorber was produced. An electromagnetic wave absorber having an insulating layer (surface layer) made of a PET film and an electromagnetic wave absorption layer made of the electromagnetic wave absorption material was produced in the same way as in Example 1-1, except that a PET film (manufactured by Toray Industries, Inc., Lumirror S10 type, thickness 38 μm) was used as a support film as an insulating layer.

The results of the evaluations using the obtained electromagnetic wave absorption material and electromagnetic wave absorber are shown in Table 2. The results of measuring the transmission attenuation amount for the electromagnetic wave absorber by the above-mentioned method were 5 dB at 60 GHz and 5 dB at 76 GHz.

Example 2

An electromagnetic wave absorption material and an electromagnetic wave absorber were produced in the same way as in Example 2-1, except that uncrosslinked hydrogenated nitrile rubber (HNBR) (manufactured by Zeon Corporation, "ZP2001") was used as an insulating polymer, the fibrous carbon nanostructure dispersion liquid and the insulating polymer solution were mixed so that the SGCNTs were 0.5 parts relative to 100 parts of the HNBR in solid content ratio to produce a slurry composition, and the thickness of the electromagnetic wave absorption layer was 34 μm.

The results of the evaluations using the obtained electromagnetic wave absorption material and electromagnetic wave absorber are shown in Table 2. The transmission attenuation amount of the obtained electromagnetic wave absorber was 7 dB at 60 GHz and 7 dB at 76 GHz.

Example 2-3

An electromagnetic wave absorption material and an electromagnetic wave absorber were produced in the same way as in Example 2-1, except that uncrosslinked nitrile rubber (NBR) (manufactured by Zeon Corporation, "DN3350") was used as an insulating polymer, the fibrous carbon nanostructure dispersion liquid and the insulating polymer solution were mixed so that the SGCNTs were 0.8 parts relative to 100 parts of the NBR in solid content ratio to produce a slurry composition, and the thickness of the electromagnetic wave absorption layer was 29 μm.

The results of the evaluations using the obtained electromagnetic wave absorption material and electromagnetic wave absorber are shown in Table 2. The transmission attenuation amount of the obtained electromagnetic wave absorber was 10 dB at 60 GHz and 9 dB at 76 GHz.

Example 2-4

An electromagnetic wave absorption material and an electromagnetic wave absorber were produced in the same way as in Example 2-1, except that uncrosslinked acrylic rubber (manufactured by Zeon Corporation, "AR12") was used as an insulating polymer, the fibrous carbon nanostructure dispersion liquid and the insulating polymer solution were mixed so that the SGCNTs were 8 parts relative to 100 parts of the acrylic rubber in solid content ratio to produce a slurry composition, and the thickness of the electromagnetic wave absorption layer was 80 μm.

The results of the evaluations using the obtained electromagnetic wave absorption material and electromagnetic wave absorber are shown in Table 2. The transmission attenuation amount of the obtained electromagnetic wave absorber was 8 dB at 60 GHz and 7 dB at 76 GHz.

Example 2-5

In the same way as in Example 2-1, the fibrous carbon nanostructure dispersion liquid and the insulating polymer solution were mixed so that the SGCNTs were 0.1 parts relative to 100 parts of the fluororubber in solid content ratio, to produce a slurry composition 2-2. Moreover, the fibrous carbon nanostructure dispersion liquid and the insulating polymer solution were mixed so that the SGCNTs were 0.3 parts relative to 100 parts of the fluororubber in solid content ratio, to produce a slurry composition 2-1.

Following this, the slurry composition 2-2 was applied to a support film (manufactured by Toray Industries, Inc., Lumirror S10 type, PET film with a thickness of 38 μm) as an insulating layer. After this, natural drying was performed at 25° C. for 1 week or more in a draft of a constant-temperature environment including a local exhaust ventilation system, to sufficiently volatilize the organic solvent and form a second electromagnetic wave absorption layer (intermediate layer) containing 0.1 parts of SGCNTs on the PET film. The thickness of the second electromagnetic wave absorption layer was measured.

Furthermore, the slurry composition 2-1 was applied to the surface of the second electromagnetic wave absorption layer. After this, natural drying was performed at 25° C. for 1 week or more in a draft of a constant-temperature environment including a local exhaust ventilation system, to sufficiently volatilize the organic solvent and form a first electromagnetic wave absorption layer. Thus, a multi-layer electromagnetic wave absorber composed of the surface layer (insulating layer), the second electromagnetic wave absorption layer, and the first electromagnetic wave absorption layer was produced.

The results of the evaluations using the obtained electromagnetic wave absorption material and electromagnetic wave absorber are shown in Table 2. Here, the thickness of the first electromagnetic wave absorption layer was calculated by subtracting the thicknesses of the insulating layer and the second electromagnetic wave absorption layer from the total thickness. The transmission attenuation amount of the obtained electromagnetic wave absorber was 6 dB at 60 GHz and 6 dB at 76 GHz.

Comparative Example 2-1

An electromagnetic wave absorption material and an electromagnetic wave absorber were produced in the same way as in Example 2-1, except that the fibrous carbon nanostructure dispersion liquid and the insulating polymer dispersion liquid were mixed so that the SGCNTs were 0.1 parts relative to 100 parts of the fluororubber in solid content ratio, and a layer with a thickness of 60 μm was formed.

The results of the evaluations using the obtained electromagnetic wave absorption material and electromagnetic wave absorber are shown in Table 2. The transmission attenuation amount of the obtained electromagnetic wave absorber was 1 dB at 60 GHz and 1 dB at 76 GHz.

Comparative Example 2-2

An electromagnetic wave absorption material and an electromagnetic wave absorber were produced in the same way as in Comparative Example 1, except that the fibrous carbon nanostructure dispersion liquid and the insulating polymer dispersion liquid were mixed so that the SGCNTs were 0.1 parts relative to 100 parts of the fluororubber in solid content ratio to form a slurry composition 2-3, and the slurry composition 2-3 was repeatedly applied onto a PET film and dried so that a layer with a thickness of 500 μm was formed.

The results of the evaluations using the obtained electromagnetic wave absorption material and electromagnetic wave absorber are shown in Table 2. The transmission attenuation amount of the obtained electromagnetic wave absorber was 2 dB at 60 GHz and 2 dB at 76 GHz.

Comparative Example 2-3

An electromagnetic wave absorption material and an electromagnetic wave absorber were produced in the same way as in Example 2-1, except that the fibrous carbon nanostructure dispersion liquid and the insulating polymer dispersion liquid were mixed so that the SGCNTs were 5 parts relative to 100 parts of the fluororubber in solid content ratio, and a layer with a thickness of 55 μm was formed.

The results of the evaluations using the obtained electromagnetic wave absorption material and electromagnetic wave absorber are shown in Table 2. The transmission attenuation amount of the obtained electromagnetic wave absorber was 23 dB at 60 GHz and 21 dB at 76 GHz.

Comparative Example 2-4

An electromagnetic wave absorption material and an electromagnetic wave absorber were produced in the same way as in Example 2-1, except that multi-walled carbon nanotubes (MWCNTs) (manufactured by Nanocyl, "Nanocyl® NC 7000") were used as fibrous carbon nanostructures instead of SGCNTs, the fibrous carbon nanostructure dispersion liquid and the insulating polymer dispersion liquid were mixed so that the MWCNTs were 0.3 parts relative to 100 parts of the fluororubber in solid content ratio, and a layer with a thickness of 60 μm was formed.

The results of the evaluations using the obtained electromagnetic wave absorption material and electromagnetic wave absorber are shown in Table 2. The transmission attenuation amount of the obtained electromagnetic wave absorber was 2 dB at 60 GHz and 2 dB at 76 GHz.

In Table 2, "HNBR" denotes hydrogenated nitrile rubber, and "NBR" denotes nitrile rubber.

TABLE 2

| | | | Example 2-1 | Example 2-2 | Example 2-3 | Example 2-4 | Example 2-5 |
|---|---|---|---|---|---|---|---|
| Electromagnetic wave absorption material | Insulating material | Rubber type | Fluororubber | HNBR | NBR | Acrylic rubber | Fluororubber |
| | Fibrous carbon nanostructures | Type | SGCNT | SGCNT | SGCNT | SGCNT | SGCNT |
| | | t-plot | Convex upward | Convex upward | Convex upward | Convex upward | Convex upward |
| | | BET specific surface area [m$^2$/g] | 880 | 880 | 880 | 880 | 880 |
| | | Content [parts by mass] | 0.3 | 0.5 | 0.8 | 0.5 | 0.3 |
| Electromagnetic wave absorber | Insulating layer | Type | PET film | PET film | PET film | PET film | PET film |
| | | Thickness [μm] | 38 | 38 | 38 | 38 | 38 |
| | Second electromagnetic wave absorption layer | Fibrous carbon nanostructures | — | — | — | — | SGCNT |
| | | Content [parts by mass] | — | — | — | — | 0.1 |
| | | Thickness [μm] | — | — | — | — | 30 |
| | First electromagnetic wave absorption layer | Fibrous carbon nanostructures | SGCNT | SGCNT | SGCNT | SGCNT | SGCNT |
| | | Content [parts by mass] | 0.3 | 0.5 | 0.8 | 0.5 | 0.3 |
| | | Thickness [μm] | 55 | 34 | 29 | 80 | 31 |
| Evaluation | Total thickness [μm] | | 93 | 72 | 67 | 118 | 99 |
| | Electromagnetic wave absorption capacity | 60 GHz [dB] | 13 | 13 | 10 | 13 | 13 |
| | | 76 GHz [dB] | 12 | 11 | 10 | 11 | 12 |
| | Durability | Tensile breaking strain [%] | 230 | 240 | 340 | 220 | 230 |
| | | Flexibility | A | A | A | A | A |

| | | | Comparative Example 2-1 | Comparative Example 2-2 | Comparative Example 2-3 | Comparative Example 2-4 |
|---|---|---|---|---|---|---|
| Electromagnetic wave absorption material | Insulating material | Rubber type | Fluororubber | Fluororubber | Fluororubber | Fluororubber |
| | Fibrous carbon nanostructures | Type | SGCNT | SGCNT | SGCNT | MWCNT |
| | | t-plot | Convex upward | Convex upward | Convex upward | Convex downward |
| | | BET specific surface area [m$^2$/g] | 880 | 880 | 880 | 265 |
| | | Content [parts by mass] | 0.1 | 0.1 | 5 | 0.3 |
| Electromagnetic wave absorber | Insulating layer | Type | PET film | PET film | PET film | PET film |
| | | Thickness [pm] | 38 | 38 | 38 | 38 |
| | Second electromagnetic wave absorption layer | Fibrous carbon nanostructures | — | — | — | — |
| | | Content [parts by mass] | — | — | — | — |
| | | Thickness [μm] | — | — | — | — |
| | First electromagnetic wave absorption layer | Fibrous carbon nanostructures | SGCNT | SGCNT | SGCNT | MWCNT |
| | | Content [parts by mass] | 0.1 | 0.1 | 5 | 0.3 |
| | | Thickness [μm] | 60 | 500 | 55 | 60 |
| Evaluation | Total thickness [μm] | | 98 | 538 | 93 | 98 |
| | Electromagnetic wave absorption capacity | 60 GHz [dB] | 3 | 3 | 1 | 2 |
| | | 76 GHz [dB] | 4 | 3 | 1 | 2 |
| | Durability | Tensile breaking strain [%] | 240 | 240 | 112 | 240 |
| | | Flexibility | A | A | B | A |

Example 3-1

<Production of Electromagnetic Wave Absorption Material>
[Production of Electromagnetic Wave Absorption Material Slurry Composition]
—CNT Dispersion Liquid Production Step—

Multi-walled carbon nanotubes (manufactured by Nanocyl, "NC7000", number average diameter: 9.5 nm, number average length: 1.5 μm, purity: 90%, metal oxide: 10%, BET specific surface area: 250 m$^2$/g to 300 m$^2$/g, t-plot: convex downward) as fibrous carbon nanostructures which are a conductive material were added to methyl ethyl ketone as an organic solvent so as to have a concentration of 0.2%, and the mixture was stirred with a magnetic stirrer for 24 hr to obtain a preliminary dispersion liquid of the CNTs.

Next, the preliminary dispersion liquid was charged into a multistage step-down high-pressure homogenizer (manufactured by Beryu Corporation, product name "BERYU SYSTEM PRO") having a multistage pressure controller (multistage step-down transformer) connected to a high-pressure dispersion treatment portion (jet mill) having a thin-tube flow path portion with a diameter of 200 μm, and a pressure of 120 MPa was applied to the preliminary dispersion liquid intermittently and instantaneously, to transfer the preliminary dispersion liquid into the thin-tube flow path and disperse it. A CNT dispersion liquid was thus obtained.

—Mixing Step—

Apart from the CNT dispersion liquid, fluororubber (manufactured by DuPont, "Viton GBL200S") as an insulating material was added to methyl ethyl ketone as an organic solvent so as to have a concentration of 2%, and stirred to dissolve the fluororubber, thus obtaining an insulating material solution.

The insulating material solution and the CNT dispersion liquid were mixed so that the blending amount ratio of the fluororubber as the insulating material and the CNTs as the fibrous carbon nanostructures was 100 parts:6 parts, to produce an electromagnetic wave absorption material slurry composition.

<Production of Electromagnetic Wave Absorber>

The slurry composition was applied to a PET film (manufactured by Toray Industries, Inc., "Lumirror S10", thickness: 38 μm) which was a film formation substrate as an insulating layer. After this, natural drying was performed at 25° C. for 1 week or more in a draft of a constant-temperature environment including a local exhaust ventilation system, to sufficiently volatilize the organic solvent. The resultant electromagnetic wave absorber was a single-layer electromagnetic wave absorber in which an electromagnetic wave absorption layer containing fluororubber as an insulating material and CNTs as fibrous carbon nanostructures was directly applied to an insulating layer containing PET as an insulating material. For such an electromagnetic wave absorber, the thickness of the electromagnetic wave absorption layer and the reflection attenuation amount of the electromagnetic wave absorber were measured according to the above-mentioned methods. The results are shown in Table 3. The results of measuring the transmission attenuation amount for the electromagnetic wave absorber by the above-mentioned method were 7 dB at 60 GHz and 7 dB at 76 GHz.

Example 3-2

A slurry composition was produced to form an electromagnetic wave absorption material in the same way as in Example 3-1, except that uncrosslinked hydrogenated acrylonitrile butadiene rubber (HNBR, manufactured by Zeon Corporation, "Zetpol 2001") was used as the insulating material of the electromagnetic wave absorption layer instead of fluororubber, and the blending amount ratio of the HNBR as the insulating material and the CNTs as the fibrous carbon nanostructures was changed as shown in Table 3. The resultant electromagnetic wave absorption material was subjected to tensile breaking strain measurement and flexibility evaluation. The results are shown in Table 3.

An electromagnetic wave absorber was produced using such a slurry composition in the same way as in Example 3-1, except that the layer thickness of the electromagnetic wave absorption layer was changed as shown in Table 3. The resultant electromagnetic wave absorber was subjected to each of the measurements. The transmission attenuation amount of the obtained electromagnetic wave absorber was 16 dB at 60 GHz and 15 dB at 76 GHz. The other measurement results are shown in Table 3.

Example 3-3

A slurry composition was produced to form an electromagnetic wave absorption material in the same way as in Example 3-1, except that uncrosslinked acrylonitrile butadiene rubber (NBR, manufactured by Zeon Corporation, "Nipol N3350") was used as the insulating material of the electromagnetic wave absorption layer instead of fluororubber, and the blending amount ratio of the NBR as the insulating material and the CNTs as the fibrous carbon nanostructures was changed as shown in Table 3. The resultant electromagnetic wave absorption material was subjected to tensile breaking strain measurement and flexibility evaluation. The results are shown in Table 3.

An electromagnetic wave absorber was produced using such a slurry composition in the same way as in Example 3-1, except that the layer thickness of the electromagnetic wave absorption layer was changed as shown in Table 3. The resultant electromagnetic wave absorber was subjected to the various measurements. The transmission attenuation amount of the obtained electromagnetic wave absorber was 18 dB at 60 GHz and 18 dB at 76 GHz. The other measurement results are shown in Table 3.

Example 3-4

A slurry composition was produced to form an electromagnetic wave absorption material in the same way as in Example 3-1, except that uncrosslinked acrylic rubber (manufactured by Zeon Corporation, "Nipol AR12") was used as the insulating material of the electromagnetic wave absorption layer instead of fluororubber, and the blending amount ratio of the acrylic rubber as the insulating material and the CNTs as the fibrous carbon nanostructures was changed as shown in Table 3. The resultant electromagnetic wave absorption material was subjected to tensile breaking strain measurement and flexibility evaluation. The results are shown in Table 3.

An electromagnetic wave absorber was produced using such a slurry composition in the same way as in Example 3-1, except that the layer thickness of the electromagnetic wave absorption layer was changed as shown in Table 3. The resultant electromagnetic wave absorber was subjected to the various measurements. The transmission attenuation amount of the obtained electromagnetic wave absorber was 11 dB at 60 GHz and 10 dB at 76 GHz. The other measurement results are shown in Table 3.

Example 3-5

<Production of Electromagnetic Wave Absorption Material>

A multi-layer electromagnetic wave absorber was produced as an electromagnetic wave absorber. Herein, to distinguish the slurry compositions used in the formation of the respective electromagnetic wave absorption layers of the multi-layer electromagnetic wave absorber, a slurry composition produced in the same way as in Example 3-1 is referred to as "first slurry composition". A second slurry composition was produced in the same way as in Example 3-1, except that the blending amount ratio of the fluororubber as the insulating material and the CNTs as the fibrous carbon nanostructures was changed to 100 parts:1 parts.

<Production of Electromagnetic Wave Absorber>

When producing an electromagnetic wave absorber using the first and second slurry compositions, first, the second slurry composition was applied to a PET film (manufactured by Toray Industries, Inc., "Lumirror S10", thickness: 38 μm) which was a film formation substrate as an insulating layer. After this, natural drying was performed at 25° C. for 1 week or more in a draft of a constant-temperature environment including a local exhaust ventilation system, to sufficiently volatilize the organic solvent. The thickness of an electromagnetic wave absorption layer (hereafter also referred to as "second electromagnetic wave absorption layer") formed using the second slurry composition was measured by the above-mentioned measurement method. The results are shown in Table 3.

In the same manner as above, an electromagnetic wave absorption layer (hereafter also referred to as "first electromagnetic wave absorption layer") was formed on the second electromagnetic wave absorption layer using the first slurry composition. For the resultant electromagnetic wave absorber having the insulating layer, the second electromagnetic wave absorption layer, and the first electromagnetic wave absorption layer adjacent to each other, the thickness of the electromagnetic wave absorption layer was measured approximately in the same way as the above-mentioned measurement method. The thicknesses of the insulating layer and the second electromagnetic wave absorption layer were subtracted from the total thickness of the electromagnetic wave absorber, to obtain the thickness of the first electromagnetic wave absorption layer.

The reflection attenuation amount and the transmission attenuation amount of the obtained electromagnetic wave absorber were measured in the same way as in Example 3-1. The transmission attenuation amount of the obtained electromagnetic wave absorber was 14 dB at 60 GHz and 13 dB at 76 GHz. The measurement result of the reflection attenuation amount is shown in Table 3.

Comparative Examples 3-1 to 3-2

A slurry composition was produced to form an electromagnetic wave absorption material in the same way as in Example 3-1, except that the blending amount ratio of the fluororubber as the insulating material and the multi-walled carbon nanotubes as the fibrous carbon nanostructures was changed as shown in Table 3. The resultant electromagnetic wave absorption material was subjected to tensile breaking strain measurement and flexibility evaluation. The results are shown in Table 3.

An electromagnetic wave absorber was produced using such a slurry composition in the same way as in Example 3-1, except that the layer thickness of the electromagnetic wave absorption layer was changed as shown in Table 3. The resultant electromagnetic wave absorber was subjected to each of the measurements. The transmission attenuation amount of the obtained electromagnetic wave absorber was 3 dB at 60 GHz and 2 dB at 76 GHz in Comparative Example 3-1, and 21 dB at 60 GHz and 0 dB at 76 GHz in Comparative Example 3-2. The other measurement results are shown in Table 3.

Comparative Example 3-3

A slurry composition was produced to form an electromagnetic wave absorption material in the same way as in Example 3-1, except that milled carbon fibers (manufactured by Nippon Polymer Sangyo Co. Ltd., "CFMP-30X", average fiber length: 40 μm, average fiber diameter: 7 μm, t-plot: unknown) were used as the conductive material instead of the fibrous carbon nanostructures of the electromagnetic wave absorption layer. The resultant electromagnetic wave absorption material was subjected to tensile breaking strain measurement and flexibility evaluation. The results are shown in Table 3.

An electromagnetic wave absorber was produced using such a slurry composition in the same way as in Example 3-1, except that the layer thickness of the electromagnetic wave absorption layer was changed as shown in Table 3. The resultant electromagnetic wave absorber was subjected to each of the measurements. The transmission attenuation amount of the electromagnetic wave absorber was 1 dB at 60 GHz and 1 dB at 76 GHz. The other measurement results are shown in Table 3.

Comparative Example 3-4

A slurry composition was produced to form an electromagnetic wave absorption material in the same way as in Example 3-1, except that carbon black (manufactured by Cancarb, "Thermax N990", average particle diameter: 280 nm, t-plot: unknown) were used as the conductive material instead of the fibrous carbon nanostructures of the electromagnetic wave absorption layer. The resultant electromagnetic wave absorption material was subjected to tensile breaking strain measurement and flexibility evaluation. The results are shown in Table 3.

An electromagnetic wave absorber was produced using such a slurry composition in the same way as in Example 3-1, except that the layer thickness of the electromagnetic wave absorption layer was changed as shown in Table 3. The resultant electromagnetic wave absorber was subjected to each of the measurements. The transmission attenuation amount of the electromagnetic wave absorber was 0.3 dB at 60 GHz and 0.1 dB at 76 GHz. The other measurement results are shown in Table 3.

In Table 3, "HNBR" denotes hydrogenated nitrile rubber, "NBR" denotes nitrile rubber, "MWCNT" denotes multi-walled carbon nanotube, "CFMP" denotes milled carbon fiber, and "PET" denotes polyethylene terephthalate.

TABLE 3

| | | | Example 3-1 | Example 3-2 | Example 3-3 | Example 3-4 | Example 3-5 |
|---|---|---|---|---|---|---|---|
| Electromagnetic wave absorption material | Insulating material | Rubber type | Fluoro-rubber | HNBR | NBR | Acrylic rubber | Fluoro-rubber |
| | | Blending amount [parts by mass] | 100 | 100 | 100 | 100 | 100 |
| | Conductive material | Type | MWCNT | MWCNT | MWCNT | MWCNT | MWCNT |
| | | t-plot | Convex downward | Convex downward | Convex downward | Convex downward | Convex downward |
| | | Blending amount [parts by mass] | 6 | 10 | 13 | 8 | 6 |
| | Tensile breaking strain [%] | | 220 | 250 | 280 | 150 | 220 |
| Electromagnetic wave absorber | Layer structure | Insulating layer Type | PET film | PET film | PET film | PET film | PET film |
| | | Layer thickness [μm] | 38 | 38 | 38 | 38 | 38 |
| | | Second electromagnetic wave absorption layer Insulating material for electromagnetic wave absorption layer | — | — | — | — | Fluoro-rubber |
| | | Blending amount of insulating material for electromagnetic wave absorption layer [parts by mass] | — | — | — | — | 100 |

TABLE 3-continued

|  |  |  |  |  |  |  |  |
|---|---|---|---|---|---|---|---|
|  |  | Conductive material | — | — | — | — | CNT |
|  |  | Blending amount of conductive material [parts by mass] | — | — | — | — | 1 |
|  |  | Layer thickness [μm] | — | — | — | — | 28 |
|  | First electromagnetic wave absorption layer | Insulating material for electromagnetic wave absorption layer | Fluoro-rubber | HNBR | NBR | Acrylic rubber | Fluoro-rubber |
|  |  | Blending amount of insulating material for electromagnetic wave absorption layer [parts by mass] | 100 | 100 | 100 | 100 | 100 |
|  |  | Conductive material | CNT | CNT | CNT | CNT | CNT |
|  |  | Blending amount of conductive material [parts by mass] | 6 | 10 | 13 | 8 | 6 |
|  |  | Layer thickness [μm] | 32 | 77 | 54 | 41 | 31 |
| Evaluation | Electromagnetic wave absorption capacity | 60 GHz [dB] | 10 | 11 | 10 | 12 | 10 |
|  |  | 76 GHz [dB] | 10 | 11 | 10 | 11 | 10 |
|  | Flexibility |  | A | A | A | B | A |

|  |  |  |  | Comparative Example 3-1 | Comparative Example 3-2 | Comparative Example 3-3 | Comparative Example 3-4 |
|---|---|---|---|---|---|---|---|
| Electromagnetic wave absorption material | Insulating material |  | Rubber type | Fluoro-rubber | Fluoro-rubber | Fluoro-rubber | Fluoro-rubber |
|  |  |  | Blending amount [parts by mass] | 100 | 100 | 100 | 100 |
|  | Conductive material |  | Type | MWCNT | MWCNT | CFMP | Carbon black |
|  |  |  | t-plot | Convex downward | Convex downward | Unknown | Unknown |
|  |  |  | Blending amount [parts by mass] | 1 | 20 | 6 | 6 |
|  |  | Tensile breaking strain [%] |  | 260 | 96 | 130 | 250 |
| Electromagnetic wave absorber | Layer structure | Insulating layer | Type | PET film | PET film | PET film | PET film |
|  |  |  | Layer thickness [μm] | 38 | 38 | 38 | 38 |
|  |  | Second electromagnetic wave absorption layer | Insulating material for electromagnetic wave absorption layer | — | — | — | — |
|  |  |  | Blending amount of insulating material for electromagnetic wave absorption layer [parts by mass] | — | — | — | — |
|  |  |  | Conductive material | — | — | — | — |
|  |  |  | Blending amount of conductive material [parts by mass] | — | — | — | — |
|  |  |  | Layer thickness [μm] | — | — | — | — |
|  |  | First electromagnetic wave absorption layer | Insulating material for electromagnetic wave absorption layer | Fluoro-rubber | Fluoro-rubber | Fluoro-rubber | Fluoro-rubber |
|  |  |  | Blending amount of insulating material for electromagnetic wave absorption layer [parts by mass] | 100 | 100 | 100 | 100 |
|  |  |  | Conductive material | CNT | CNT | CFMP | Carbon black |
|  |  |  | Blending amount of conductive material [parts by mass] | 1 | 20 | 6 | 6 |
|  |  |  | Layer thickness [μm] | 30 | 34 | 55 | 60 |
| Evaluation | Electromagnetic wave absorption capacity |  | 60 GHz [dB] | 4 | 1 | 6 | 1 |
|  |  |  | 76 GHz [dB] | 4 | 1 | 5 | 1 |
|  | Flexibility |  |  | A | C | B | A |

As can be understood from Tables 1 to 3, the electromagnetic wave absorber of each Example that contained fibrous carbon nanostructures and an insulating material and in which the content of the fibrous carbon nanostructures having a predetermined attribute was in a predetermined range where the blending amount of the insulating material was 100 parts exhibited a reflection attenuation amount of 10 dB or more at each measured frequency, and had sufficiently high electromagnetic wave absorption capacity in a high frequency domain of more than 20 GHz. In each Comparative Example in which the content or attribute of fibrous carbon nanostructures did not satisfy a predetermined condition, on the other hand, the electromagnetic wave absorption capacity in a high frequency domain of more than 20 GHz was insufficient.

INDUSTRIAL APPLICABILITY

It is thus possible to obtain an electromagnetic wave absorption material and an electromagnetic wave absorber capable of absorbing an electromagnetic wave of a high frequency domain of more than 20 GHz.

The invention claimed is:

1. An electromagnetic wave absorber, comprising:

a plurality of electromagnetic wave absorption layers each including fibrous carbon nanostructures and an insulating material, wherein fibrous carbon nanostructures and/or insulating materials included in the respective plurality of electromagnetic wave absorption layers are of a same type or different types, the plurality of electromagnetic wave absorption layers are denoted as a first electromagnetic wave absorption layer, a second electromagnetic wave absorption layer, ..., and an nth electromagnetic wave absorption layer from a side farther from an electromagnetic wave incidence side, contents of the fibrous carbon nanostructures in the respective plurality of electromagnetic wave absorption layers are denoted as A1 parts by mass, A2 parts by mass, ..., and An parts by mass where a content of the insulating material in a corresponding electromagnetic wave absorption layer is 100 parts by mass, and the following condition (1-2) and condition (2) or (3) hold true:

$0.3 \leq A1 \leq 0.8$, wherein the fibrous carbon nanostructures are fibrous carbon nanostructures that exhibit a convex upward shape in a $t$-plot obtained from an adsorption isotherm and have BET specific surface area of 800 m$^2$/g or more (1-2)

$A1 > A2$, when $n$ is 2 (2)

$A1 > A2 \geq \ldots \geq An$, when $n$ is a natural number of 3 or more (3), and the first electromagnetic wave absorption layer from among all of the plurality of electromagnetic wave absorption layers has a highest content of fibrous carbon nanostructures.

2. The electromagnetic wave absorber according to claim 1, wherein the insulating material is an insulating polymer, and the insulating polymer is any of: (a) thermoplastic resin and/or thermosetting resin; and (b) rubber and/or elastomer.

3. The electromagnetic wave absorber according to claim 1, further comprising an insulating layer at an outermost surface on a side where the electromagnetic wave is incident on.

4. The electromagnetic wave absorber according to claim 1, wherein a total thickness of the electromagnetic wave absorber is 1 μm or more and 500 μm or less.

5. The electromagnetic wave absorber according to claim 1, wherein an average diameter of the fibrous carbon nanostructures is 0.5 nm or more and 15 nm or less.

6. The electromagnetic wave absorber according to claim 1, wherein the average diameter of the fibrous carbon nanostructures is 1 nm or more and 10 nm or less.

7. The electromagnetic wave absorber according to claim 1, wherein the electromagnetic wave absorber absorbs an electromagnetic wave in a frequency domain of more than 20 GHz.

* * * * *